(12) United States Patent
Choi et al.

(10) Patent No.: US 8,895,693 B2
(45) Date of Patent: Nov. 25, 2014

(54) ELECTRON-DONATING POLYMERS AND ORGANIC SOLAR CELLS INCLUDING THE SAME

(75) Inventors: Yeong Suk Choi, Suwon-si (KR); Soo-Ghang Ihn, Hwaseong-si (KR); Bulliard Xavier, Suwon-si (KR); Sung Young Yun, Suwon-si (KR); Youn Hee Lim, Seoul (KR); In Sun Park, Seoul (KR); Yeon Ji Chung, Seoul (KR)

(73) Assignee: Samsung Electronics Co., Ltd., Gyeonggi-Do ( * ) Notice: Subject to any disclaimer, the term of this patent is extended or adjusted under 35 U.S.C. 154(b) by 613 days.

(21) Appl. No.: 13/166,435

(22) Filed: Jun. 22, 2011

(65) Prior Publication Data

US 2011/0315225 A1 Dec. 29, 2011

(30) Foreign Application Priority Data

Jun. 25, 2010 (KR) .................. 10-2010-0060515
May 3, 2011 (KR) .................. 10-2011-0041996

(51) Int. Cl.
| | |
|---|---|
| *C08G 75/00* | (2006.01) |
| *H01L 51/00* | (2006.01) |
| *C08G 61/12* | (2006.01) |
| *B82Y 10/00* | (2011.01) |
| *C09B 69/10* | (2006.01) |
| *H01L 51/42* | (2006.01) |

(52) U.S. Cl.
CPC .... *H01L 51/0043* (2013.01); *C08G 2261/3243* (2013.01); *C08G 2261/91* (2013.01); *C08G 2261/1426* (2013.01); *C08G 2261/414* (2013.01); *H01L 51/0047* (2013.01); *C08G 61/126* (2013.01); *C08G 2261/142* (2013.01); *B82Y 10/00* (2013.01); *C08G 2261/1428* (2013.01); *C09B 69/109* (2013.01); *H01L 51/4253* (2013.01); *C08G 2261/1424* (2013.01); *C08G 2261/148* (2013.01); *H01L 51/0036* (2013.01); *H01L 51/0003* (2013.01); *C08G 2261/146* (2013.01); *Y02E 10/549* (2013.01); *C08G 2261/124* (2013.01)
USPC .................. 528/377; 528/378; 528/380

(58) Field of Classification Search
USPC .......................... 528/377, 378, 380
See application file for complete search history.

(56) References Cited

U.S. PATENT DOCUMENTS

| | | | |
|---|---|---|---|
| 4,125,414 | A | 11/1978 | Tang et al. |
| 4,175,981 | A | 11/1979 | Loutfy et al. |
| 4,329,535 | A | 5/1982 | Rapp |
| 4,356,429 | A | 10/1982 | Tang |
| 4,913,744 | A | 4/1990 | Hoegl et al. |

(Continued)

FOREIGN PATENT DOCUMENTS

| | | |
|---|---|---|
| EP | 1 916 250 | 4/2008 |
| JP | 2009-060051 A | 3/2009 |

(Continued)

OTHER PUBLICATIONS

C.W. Tang; "Two-layer organic photovoltaic cell"; Applied Physics Letters, vol. 48, p. 183-185, 1986.

(Continued)

*Primary Examiner* — Shane Fang
(74) *Attorney, Agent, or Firm* — Harness, Dickey & Pierce, P.L.C.

(57) ABSTRACT

An electron-donating polymer including a repeating unit A with a repeating unit represented by Chemical Formula 1 and at least one of repeating units represented by Chemical Formulae 2-4.

25 Claims, 6 Drawing Sheets

(56) References Cited

U.S. PATENT DOCUMENTS

| | | | |
|---|---|---|---|
| 6,913,710 | B2 | 7/2005 | Farrand et al. |
| 7,071,289 | B2 | 7/2006 | Sotzing |
| 7,118,692 | B2 | 10/2006 | Nordquist et al. |
| 7,147,936 | B2 | 12/2006 | Louwet et al. |
| 7,183,418 | B2 | 2/2007 | Heeney et al. |
| 7,244,809 | B2 | 7/2007 | Giles et al. |
| 7,432,340 | B2 | 10/2008 | Zahn et al. |
| 7,470,377 | B2 | 12/2008 | Heeney et al. |
| 7,507,764 | B2 | 3/2009 | Hirsch |
| 7,524,922 | B2 | 4/2009 | Heeney et al. |
| 7,541,425 | B2 | 6/2009 | Heeney et al. |
| 7,572,879 | B2 | 8/2009 | Zahn et al. |
| 7,667,230 | B2 | 2/2010 | Zhu et al. |
| 7,700,643 | B2 | 4/2010 | Heeney et al. |
| 7,714,098 | B2 | 5/2010 | Heeney et al. |
| 7,754,847 | B2 | 7/2010 | Chan et al. |
| 7,781,673 | B2 | 8/2010 | Gaudiana et al. |
| 7,838,624 | B2 | 11/2010 | Laird et al. |
| 2005/0022856 | A1 | 2/2005 | Komatsu et al. |
| 2005/0061364 | A1 | 3/2005 | Peumans et al. |
| 2005/0143327 | A1 | 6/2005 | Hirsch |
| 2006/0289058 | A1 | 12/2006 | Skabara et al. |
| 2008/0087326 | A1 | 4/2008 | Scholes et al. |
| 2008/0102559 | A1 | 5/2008 | Ong et al. |
| 2008/0103286 | A1 | 5/2008 | Ong et al. |
| 2008/0154019 | A1 | 6/2008 | Hwang et al. |
| 2008/0213324 | A1 | 9/2008 | Zhou et al. |
| 2008/0315751 | A1 | 12/2008 | Sheina et al. |
| 2009/0221740 | A1 | 9/2009 | Sheina |
| 2009/0299029 | A1 | 12/2009 | Chan et al. |
| 2010/0006154 | A1 | 1/2010 | Kitazawa et al. |
| 2010/0032018 | A1 | 2/2010 | Zhu et al. |
| 2010/0243051 | A1 | 9/2010 | Slager |
| 2010/0292433 | A1 | 11/2010 | Chen et al. |
| 2011/0006287 | A1 | 1/2011 | You et al. |
| 2011/0017956 | A1 | 1/2011 | Hou et al. |
| 2011/0114159 | A1 | 5/2011 | Smith et al. |
| 2011/0315224 | A1 | 12/2011 | Choi et al. |
| 2011/0315225 | A1 | 12/2011 | Choi et al. |
| 2013/0087202 | A1 | 4/2013 | Ihn et al. |

FOREIGN PATENT DOCUMENTS

| | | |
|---|---|---|
| KR | 10-0872957 B | 12/2008 |
| KR | 2011-0140525 A | 1/2012 |
| KR | 2011-0140552 A | 1/2012 |
| WO | WO 2009/051275 A1 | 4/2009 |
| WO | WO 2009/052215 A1 | 4/2009 |
| WO | WO 2009/104781 A1 | 8/2009 |
| WO | WO 2009/152165 A2 | 12/2009 |
| WO | WO 2010/008672 | 1/2010 |
| WO | WO 2010/136401 A2 | 12/2010 |
| WO | WO 2012/003919 A2 | 1/2012 |

OTHER PUBLICATIONS

"Perylene Spec Sheet"; LookChem.com; 2008 <http://www.lookchem.com/cas-198/198-55-0.html>.

"Tetraphenylbutadiene Spec Sheet"; LookChem.com; 2008 <http://www.lookchem.com/1-1-4-4-Tetraphenylbutadiene/>.

S. Prahl; "Coumarin Absorption/Emission Spectra"; Oregon Medical Laser Center; Mar. 2012; <http://omlc.ogi.edu/spectra/PhotochemCAD/html/045.html>.

V. Gehman, et al.; "Fluorescence efficiency and visible re-emission spectrum of tetraphenyl butadiene films at extreme ultraviolet wavelengths"; Nuclear Instruments and Methods in Physics Research Section A: Accelerators, Spectrometers, Detectors, and Associated Equipment, vol. 654, p. 116-121; 2011.

"Dhanveen Pigments Copper Phthalocyanine Spec Sheet"; Dhanveen Pigments Pvt.Ltd.; 2013; <http://www.dhanveenpigments.com/copper-phthalocyanine-crude-cpc-blue--306522.html>.

F. Saunders, "Crystalline poly-p-tert-butylstyrene"; Journal of Polymer Science Part A-1, vol. 5; 1967.

Office Action dated Feb. 27, 2014 for co-pending U.S. Appl. No. 13/371,933.

Liang et al., "Development of New Semiconducting Polymers for High Performance Solar Cell", J. Am. Chem. Soc., 2009, 131, pp. 56-57, and supplemental information.

Sajadi et al., "Time-resolved fluorescence spectra of cis-stilbene in hexane and acetonitrile", Chemical Physics Letters, 489 (2010), pp. 44-47.

Prahl, "Absorption and Emission Spectra for Trans-stilbene".

Wu et al., "An ultraviolet responsive hybrid solar cell based on titania/Poly (3-hexylthiophene", Scientific Reports 3: 1283, Feb. 15, 2013, pp. 1-6.

US Office Action dated Jul. 31, 2013 corresponding to U.S. Appl. No. 13/371,933.

Hou, Jianhui, et al. "Synthesis of a Low Band Gap Polymer and Its Application in Highly Efficient Polymer Solar Cells." J. Am. Chem. Soc. 2009, 131, 15586-15587, XP-002660031.

Liang, Yongye, et al. "Highly Efficient Solar Cell Polymers Developed via Fine-Tuning of Structural and Electronic Properties." J. Am. Chem. Soc. 2009, 131, 7792-7799, XP-002660032.

European Search Report dated Oct. 12, 2011, in corresponding European Patent Application No. 11171285.7.

US Office Action dated Dec. 23, 2013 corresponding to U.S. Appl. No. 13/477,850.

European Search Report dated Sep. 17, 2012, in corresponding European Patent Application No. 12168879.0.

Huo, L., et al., "Replacing Alkoxy Groups with Alkylthienyl Groups: A Feasible Approach to Improve the Properties of Photovoltaic Polymers," Angewandte Chemie International Edition, vol. 50, No. 41, pp. 9697 to 9702 (Oct. 4, 2011).

Kim, K.J., et al. "Passivation films with SU-8 polymers for organic solar cell protection from ultraviolet ray", Solar Energy Materials and Solar Cells, vol. 95, pp. 1238-1242, Feb. 3, 2011.

Kleinhenz, N., et al., "Low-Band Gap Polymers That Utilize Quinoid Resonance Structure Stabilization by Thienothiophene: Fine-Tuning of HOMO level," Macromolecules, vol. 44, No. 4, pp. 872-877 (Feb. 22, 2011).

Liang, Y., et al., "For the Bright Future—Bulk Heterojunction Polymer Solar Cells with Power Conversion Efficiency of 7.4%", Adv. Mater. 2010, pp. E135-E138, Jan. 4, 2010.

Peet, J., et al., "Efficiency enhancement in low-bandgap polymer solar cells by processing with alkane dithols", nature materials, vol. 6 Jul. 2007, pp. 497-500, May 27, 2007.

Pomerantz, M. and Gu, X., "Poly(2-decylthieno[3,4-b]thiophene). A New Soluble Low-Bandgap Conducting Polymer", Synthetic Metals, vol. 84, 1997, pp. 243-244.

Ryu, M.-S., et al. "Improvement of operation lifetime for conjugated polymer:fullerene organic solar cells by introducing a UV absorbing film", Solar Energy Materials & Solar Cells, vol. 94, pp. 152-156, Sep. 4, 2009.

Scharber, M. C. et al., "Design Rules for Donors in Bulk-Heterojunction Solar Cells—Towards 10% Energy-Conversion Efficiency", Advanced Materials, 2006, vol. 18, pp. 789-794.

Wynberg, H. et al., "Synthesis of an Asymmetric Heterotriptycene", The Journal of Organic Chemistry, vol. 35, No. 3, Mar. 1970, pp. 711-715.

Yamamoto, T., et al., "Synthesis and Characterization of Thieno[3,4-b]thiophene-Based Copolymers Bearing 4-Substituted Phenyl Ester Pendants: Facile Fine-Tuning of HOMO Energy Levels," Macromolecules, vol. 44, No. 17, pp. 6659-6662, (Sep. 13, 2011).

Zilio, S.D., et al., "Fabrication of a light trapping system for organic solar cells", Microelectronic Engineering, vol. 86, pp. 1150-1154, Feb. 11, 2009.

Advisory Action and Interview Summary dated Jun. 19, 2014 issued in U.S. Appl. No. 13/371,933.

ELECTRON-DONATING POLYMERS AND ORGANIC SOLAR CELLS INCLUDING THE SAME

CROSS-REFERENCE TO RELATED APPLICATIONS

This application claims priority under 35 U.S.C. §119 to Korean Patent Application No. 10-2010-0060515 filed in the Korean Intellectual Property Office (KIPO) on Jun. 25, 2010, and to Korean Patent Application No. 10-2011-0041996 filed in the Korean Intellectual Property Office (KIPO) on May 3, 2011, the entire contents of which are incorporated herein by reference.

BACKGROUND

1. Field

Example embodiments relate to electron-donating polymers and organic solar cells including the same.

2. Description of the Related Art

A solar cell is a photoelectric conversion device that transforms solar energy into electrical energy, and has attracted much attention as an infinite but pollution-free next generation energy source. A solar cell includes p-type and n-type semiconductors and produces electrical energy by transferring electrons and holes to the n-type and p-type semiconductors, respectively, and then collecting electrons and holes in each electrode when an electron-hole pair (EHP) is produced by solar light energy absorbed in a photoactive layer inside the semiconductors.

A solar cell may be classified into an organic solar cell and an inorganic solar cell according to materials used as a thin film. The organic solar cell may be classified into a bi-layer p-n junction structure in which a p-type semiconductor is formed in a separate layer from an n-type semiconductor, and a bulk heterojunction structure in which a p-type semiconductor is mixed with an n-type semiconductor.

SUMMARY

Some example embodiments may provide electron-donating polymers capable of absorbing light with a wide wavelength region and improving hole mobility. Other example embodiments may provide organic solar cells capable of increasing a light absorption rate, a short circuit current density ($J_{sc}$), an open circuit voltage ($V_{oc}$), and/or hole mobility, and have improved efficiency.

According to some example embodiments, an electron-donating polymer includes a repeating unit A including a repeating unit represented by the following Chemical Formula 1 and at least one of repeating units represented by the following Chemical Formulae 2-4.

[Chemical Formula 1]

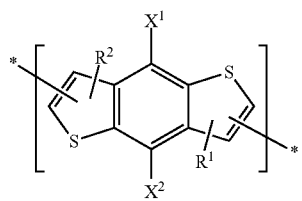

In Chemical Formula 1, $X^1$ and $X^2$ are the same or different, and are each independently hydrogen, a halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, or $SR^{100}$. $R^{100}$ is a substituted or unsubstituted C1 to C20 aliphatic organic group, a substituted or unsubstituted C2 to C30 aromatic organic group, or a substituted or unsubstituted C2 to C30 heterocycloalkyl group.

The $X^1$ and $X^2$ are the same or different, and are each independently a substituted or unsubstituted C1 to C20 alkyl group, a substituted or unsubstituted C1 to C20 alkoxy group, a substituted or unsubstituted C1 to C20 ester group, or —$SR^{100}$, $R^{100}$ being a substituted or unsubstituted C1 to C20 alkyl group, or a substituted or unsubstituted C2 to C30 heterocycloalkyl group.

$R^1$ and $R^2$ are the same or different, and are each independently selected from the group consisting of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof, or at least one $CH_2$ group included in the $R^1$ and $R^2$ is substituted with —O—, —S—, —$SO_2$—, —CO—, —OCO—, —COO—, —CH=CH—, —C≡C—, or —$SiR^{101}R^{102}$ ($R^{101}$ and $R^{102}$ being the same or different, and are each independently selected from the group consisting of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof). $R^1$ and $R^2$ are the same or different, and are each independently hydrogen, or a substituted or unsubstituted C1 to C20 alkyl group.

[Chemical Formula 2]

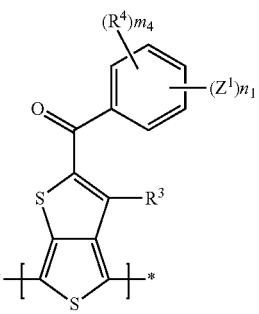

[Chemical Formula 3]

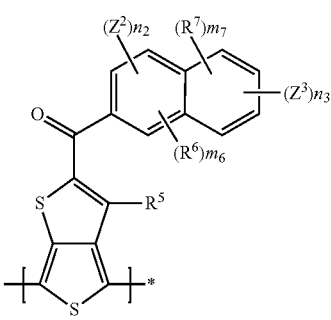

-continued

[Chemical Formula 4]

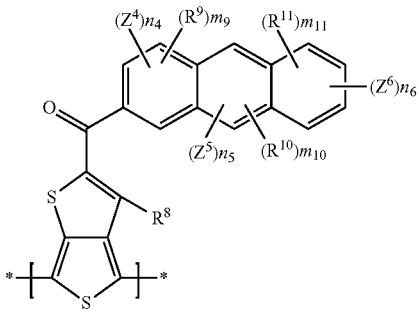

In Chemical Formulae 2-4, $Z^1$ to $Z^6$ are the same or different, and are each independently hydrogen or an electron withdrawing group. The electron withdrawing group is —$CF_3$, —$CCl_3$, —$CBr_3$, —$Cl_3$, —F, —Cl, —Br, —I, —$NO_2$, —NO, —CN, —$COCH_3$, —$CO_2C_2H_5$, —$SO_3$, —$SO_3R^{106}$ ($R^{106}$ being the same or different in each repeating unit, and is independently hydrogen, or a substituted or unsubstituted C1 to C20 aliphatic organic group), a residual group derived from a metal sulfonate (the metal being a Group 1 metal or Group 2 metal), or a C2 to C30 aromatic organic group.

The $Z^1$ to $Z^6$ are the same or different, and are each independently hydrogen, —$SO_3R^{106}$ ($R^{106}$ being the same or different in each repeating unit, and is independently hydrogen, or a substituted or unsubstituted C1 to C20 aliphatic organic group), a halogen, —$NO_2$, —NO, or —CN. $n_1$ is an integer ranging from 1 to 5. $n_2$ is an integer ranging from 0 to 3, $n_3$ is an integer ranging from 0 to 4, and $n_2+n_3$ is an integer ranging from 1 to 5. $n_4$ is an integer ranging from 0 to 3, $n_5$ is an integer ranging from 0 to 2, $n_6$ is an integer ranging from 0 to 4, and $n_4+n_5+n_6$ is an integer ranging from 1 to 5.

$R^4$, $R^6$, $R^7$, and $R^9$ to $R^{11}$ are the same or different, and are each independently selected from the group consisting of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and combination thereof, or at least one $CH_2$ group included in the $R^4$, $R^6$, $R^7$, and $R^9$ to $R^{11}$ is substituted with —O—, —S—, —$SO_2$—, —CO—, —OCO—, —COO—, —CH=CH—, —C≡C—, or —$SiR^{103}R^{104}$ ($R^{103}$ and $R^{104}$ being the same or different, and each being independently selected from the group consisting of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof).

The $R^4$, $R^6$, $R^7$, and $R^9$ to $R^{11}$ are the same or different, and are each independently hydrogen, or a substituted or unsubstituted C1 to C20 alkyl group. $R^3$, $R^5$, and $R^8$ are the same or different, and are each independently hydrogen, a halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, or —$SR^{105}$, $R^{105}$ being a substituted or unsubstituted C1 to C20 aliphatic organic group, a substituted or unsubstituted C2 to C30 aromatic organic group, or a substituted or unsubstituted C2 to C30 heterocycloalkyl group.

The $R^3$, $R^5$, and $R^8$ are the same or different, and are each independently hydrogen or a halogen. $m_4$ is the same or different in each repeating unit, and are each independently an integer ranging from 0 to 5, $m_6$ and $m_9$ are each independently an integer ranging from 0 to 3, $m_7$ and $m_{11}$ are each independently an integer ranging from 0 to 4, and $m_{10}$ is the same or different in each repeating unit, and are each independently an integer ranging from 0 to 2.

In the electron-donating polymer, the repeating unit A may include repeating units represented by the following Chemical Formulae 7-1 to 7-3, or a combination thereof.

[Chemical Formula 7-1]

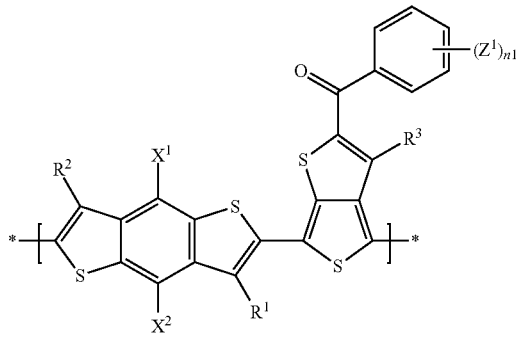

[Chemical Formula 7-2]

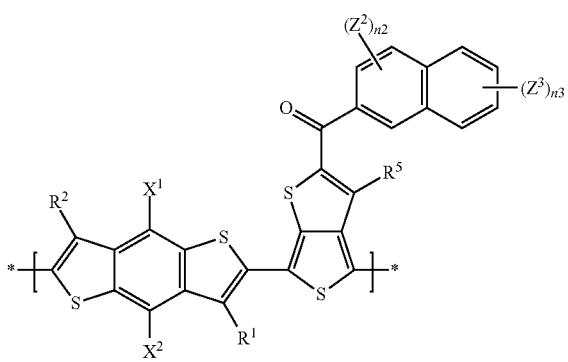

[Chemical Formula 7-3]

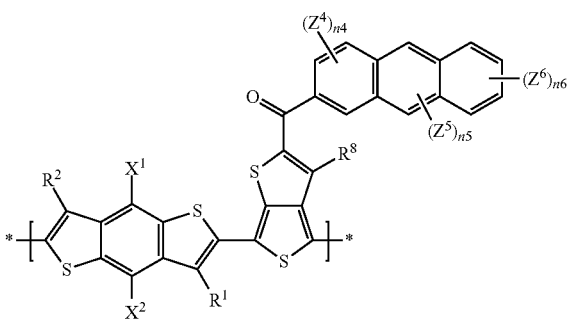

In Chemical Formulae 7-1 to 7-3, $X^1$ and $X^2$ are the same or different, and are each independently a substituted or unsubstituted C1 to C20 alkyl group, a substituted or unsubstituted C1 to C20 alkoxy group, a substituted or unsubstituted C1 to C20 ester group, or —$SR^{100}$, $R^{100}$ being a substituted or unsubstituted C1 to C20 alkyl group, or a substituted or unsubstituted C2 to C30 heterocycloalkyl group, and the $X^1$ and $X^2$ are the same or different, and are each independently a substituted or unsubstituted C1 to C20 alkoxy group.

$R^1$ and $R^2$ are the same or different, and are each independently hydrogen, or a substituted or unsubstituted C1 to C20 alkyl group, and hydrogen. $R^3$, $R^5$, and $R^8$ are the same or different, and are each independently hydrogen or a halogen, and hydrogen. $Z^1$ to $Z^6$ are the same or different, and are each independently hydrogen, $-SO_3R^{106}$ ($R^{106}$ being the same or different in each repeating unit, and being independently hydrogen, or a substituted or unsubstituted C1 to C20 aliphatic organic group), a halogen, $-NO_2$, $-NO$, or $-CN$. $n_1$ is an integer of 1 or 2, $n_2$ is an integer ranging from 0 to 2, $n_3$ is an integer ranging from 0 to 2, and $n_2+n_3$ is an integer of 1 or 2, $n_4$ is an integer ranging from 0 to 2, $n_5$ is an integer ranging from 0 to 2, $n_6$ is an integer ranging from 0 to 2, and $n_4+n_5+n_6$ is an integer of 1 or 2.

The electron-donating polymer may include a repeating unit represented by Chemical Formula 1 and at least one of repeating units represented by Chemical Formulae 2-4 at a mole ratio of about 1:1 to about 1:1.4. The electron-donating polymer may have a number average molecular weight of about 1000 to about 800,000. In addition, the electron-donating polymer may have a bandgap ranging from about 1.2 eV to about 2.5 eV.

According to still other example embodiments, an electron-donating polymer includes a repeating unit A including a repeating unit represented by Chemical Formula 1 and at least one of repeating units represented by Chemical Formulae 2-4; and a repeating unit B including a repeating unit represented by Chemical Formula 1 and a repeating unit represented by Chemical Formula 9.

Hereinafter, when another description is not provided, Chemical Formula 1, Chemical Formulae 2-4, and a repeating unit A are the same as described above.

[Chemical Formula 9]

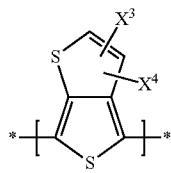

In Chemical Formula 9, $X^3$ is the same or different in each repeating unit, and each is independently an electron-accepting group including two ester residual groups and a substituted or unsubstituted divalent aliphatic organic group linking the ester residual groups, and $X^4$ is the same or different in each repeating unit, and each is independently hydrogen, a halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, or $-SR^{107}$, $R^{107}$ being a substituted or unsubstituted C1 to C20 aliphatic organic group, a substituted or unsubstituted C2 to C30 aromatic organic group, or a substituted or unsubstituted C2 to C30 heterocycloalkyl group.

A repeating unit represented by Chemical Formula 9 may include a repeating unit represented by the following Chemical Formula 9-1, a repeating unit represented by Chemical Formula 9-2, or a combination thereof.

[Chemical Formula 9-1]

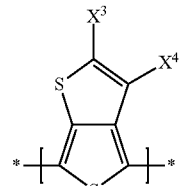

[Chemical Formula 9-2]

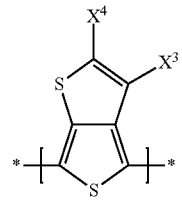

In Chemical Formulae 9-1 and 9-2, $X^3$ is the same or different in each repeating unit, and each is independently an electron-accepting group including two ester residual groups and a substituted or unsubstituted divalent aliphatic organic group linking the ester residual groups. $X^4$ is the same or different in each repeating unit, and each is independently hydrogen, a halogen, or a substituted or unsubstituted C1 to C20 alkyl group, and hydrogen.

The electron-accepting group including two ester residual groups and a substituted or unsubstituted divalent aliphatic organic group linking the ester residual groups may include a functional group represented by the following Chemical Formula 10-1 or 10-2.

[Chemical Formula 10-1]

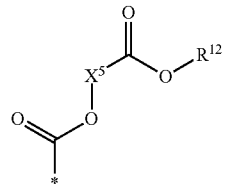

[Chemical Formula 10-2]

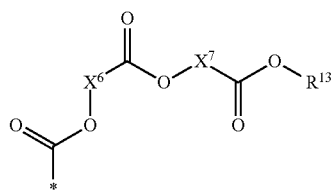

In Chemical Formulae 10-1 and 10-2, $X^5$ to $X^7$ are the same or different, and are each independently a substituted or unsubstituted divalent C1 to C20 aliphatic organic group, and $R^{12}$ and $R^{13}$ are the same or different, and are each independently hydrogen, or a substituted or unsubstituted C1 to C20 aliphatic organic group.

In the electron-donating polymer, the repeating unit B may include a repeating unit represented by the following Chemical Formula 12.

[Chemical Formula 12]

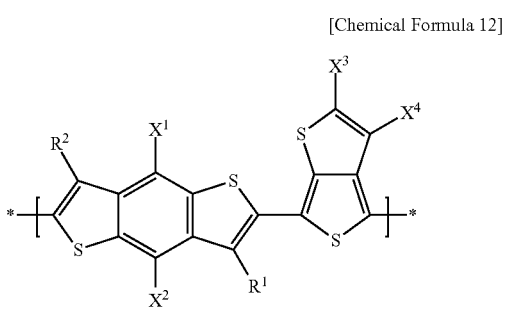

In Chemical Formula 12, $X^1$ and $X^2$ are the same or different, and are each independently a substituted or unsubstituted C1 to C20 alkyl group, a substituted or unsubstituted C1 to C20 alkoxy group, a substituted or unsubstituted C1 to C20 ester group, or —$SR^{100}$, $R^{100}$ being a substituted or unsubstituted C1 to C20 alkyl group, or a substituted or unsubstituted C2 to C30 heterocycloalkyl group, and a substituted or unsubstituted C1 to C20 alkoxy group.

$R^1$ and $R^2$ are the same or different, and are each independently hydrogen, or a substituted or unsubstituted C1 to C20 alkyl group, and hydrogen. $X^3$ is the same or different in each repeating unit, and each is independently an electron-accepting group including two ester residual groups and a substituted or unsubstituted divalent aliphatic organic group linking the ester residual groups. $X^4$ is the same or different in each repeating unit, and each is independently hydrogen, a halogen, or a substituted or unsubstituted C1 to C20 alkyl group, and hydrogen. The electron-donating polymer may include the repeating unit A and the repeating unit B at a mole ratio of about 1:10 to about 10:1. The electron-donating polymer may have a number average molecular weight ranging from about 1000 to about 800,000. The electron-donating polymer may have a bandgap ranging from about 1.2 eV to about 2.5 eV.

According to yet other example embodiments, an organic solar cell includes an anode and a cathode facing each other, and a photoactive layer disposed between the anode and the cathode and including an electron donor including the electron-donating polymer and an electron acceptor.

According to example embodiments, an electron-donating polymer includes a repeating unit A including a repeating unit according to Chemical Formula 1 and at least one repeating unit according to one of Chemical Formulae 2-4.

According to at least one example embodiment, an electron-donating polymer includes a repeating unit A including a repeating unit according to Chemical Formula 1 and at least one repeating unit according to one of Chemical Formulae 2-4, and a repeating unit B including a repeating unit according to Chemical Formula 1 and a repeating unit according to Chemical Formula 9.

In Chemical Formula 1, X1 and X2 are one of the same and different, and are each independently one of hydrogen, a halogen, one of a substituted and unsubstituted C1-C20 aliphatic organic group, a hydroxy group, one of a substituted and unsubstituted C1-C20 alkoxy group, one of a substituted and unsubstituted C1-C20 ester group, a thiol group, and SR100, where R100 is one of one of a substituted and unsubstituted C1-C20 aliphatic organic group, one of a substituted and unsubstituted C2-C30 aromatic organic group, and one of a substituted and unsubstituted C2-C30 heterocycloalkyl group.

R1 and R2 are one of the same and different, and one of R1 and R2 are each independently one of hydrogen, one of a substituted and unsubstituted C1-C20 linear or branched alkyl group, on of a substituted and unsubstituted C3-C20 cycloalkyl group, one of a substituted and unsubstituted C1-C20 alkoxy group, one of a substituted and unsubstituted C6-C30 aryl group, one of a substituted and unsubstituted C2-C30 heteroaryl group, and a combination thereof, and at least one CH2 group included in the R1 and R2 is substituted with one of —O—, —S—, —SO2-, —CO—, —COO—, —COO—, —CH=CH—, —C≡C—, and —SiR101R102, where R101 and R102 are one of the same and different, and R101 and R102 are each independently one of hydrogen, one of a substituted and unsubstituted C1-C20 linear or branched alkyl group, one of a substituted and unsubstituted C3-C20 cycloalkyl group, one of a substituted and unsubstituted C1-C20 alkoxy group, one of a substituted and unsubstituted C6-C30 aryl group, one of a substituted and unsubstituted C2-C30 heteroaryl group, and a combination thereof.

In Chemical Formulae 2-4, Z1-Z6 are one of the same and different, and are each independently one of hydrogen and an electron withdrawing group, n1 is an integer ranging from 1 to 5, inclusive, n2 is an integer ranging from 0 to 3, inclusive, n3 is an integer ranging from 0 to 4, inclusive, n2+n3 is an integer ranging from 1 to 5, inclusive, n4 is an integer ranging from 0 to 3, inclusive, n5 is an integer ranging from 0 to 2, inclusive, n6 is an integer ranging from 0 to 4, inclusive, n4+n5+n6 is an integer ranging from 1 to 5, inclusive.

R4, R6, R7, and R9-R11 are one of the same and different, and one of R4, R6, R7, and R9-R11 are each independently one of hydrogen, one of a substituted and unsubstituted C1-C20 linear or branched alkyl group, one of a substituted and unsubstituted C3-C20 cycloalkyl group, one of a substituted and unsubstituted C1-C20 alkoxy group, one of a substituted and unsubstituted C6-C30 aryl group, one of a substituted and unsubstituted C2-C30 heteroaryl group, and a combination thereof, and at least one CH2 group included in the R4, R6, R7, and R9-R11 is substituted with one of —O—, —S—, —SO2-, —CO—, —COO—, —COO—, —CH=CH—, —C≡C—, and —SiR103R104, where R103 and R104 are one of the same and different, and R103 and R104 are each independently one of hydrogen, one of a substituted and unsubstituted C1-C20 linear or branched alkyl group, one of a substituted and unsubstituted C3-C20 cycloalkyl group, one of a substituted and unsubstituted C1-C20 alkoxy group, one of a substituted and unsubstituted C6-C30 aryl group, one of a substituted and unsubstituted C2-C30 heteroaryl group, and a combination thereof.

R3, R5, and R8 are one of the same and different, and are each independently one of hydrogen, a halogen, one of a substituted and unsubstituted C1-C20 aliphatic organic group, a hydroxy group, one of a substituted and unsubstituted C1-C20 alkoxy group, one of a substituted and unsubstituted C1-C20 ester group, a thiol group, and —SR105, where R105 is one of one of a substituted and unsubstituted C1-C20 aliphatic organic group, one of a substituted and unsubstituted C2-C30 aromatic organic group, and one of a substituted and unsubstituted C2-C30 heterocycloalkyl group.

Each m4 is one of the same and different in each repeating unit, and each m4 is independently an integer ranging from 0 to 5, inclusive, m6 and m9 are each independently an integer ranging from 0 to 3, inclusive, m7 and m11 are each independently an integer ranging from 0 to 4, inclusive, and m10 is one of the same and different in each repeating unit, and each m10 is independently an integer ranging from 0 to 2, inclusive, and in Chemical Formula 9, X3 is one of the same and different in each repeating unit, and each X3 is independently one of an electron-accepting group including two ester residual groups and one of a substituted and unsubstituted divalent aliphatic organic group linking the ester residual groups.

X4 is one of the same and different in each repeating unit, and each X4 is independently one of hydrogen, a halogen, one of a substituted and unsubstituted C1-C20 aliphatic organic group, a hydroxy group, one of a substituted and unsubstituted C1-C20 alkoxy group, one of a substituted and unsubstituted C1-C20 ester group, a thiol group, and —SR107, where R107 is one of one of a substituted and unsubstituted C1-C20 aliphatic organic group, one of a substituted and unsubstituted C2-C30 aromatic organic group, and one of a substituted and unsubstituted C2-C30 heterocycloalkyl group.

BRIEF DESCRIPTION OF THE DRAWINGS

Example embodiments will be more clearly understood from the following brief description taken in conjunction with the accompanying drawings.

FIG. 1 is a cross-sectional diagram illustrating organic solar cells according to example embodiments;

FIG. 2 is an IR spectrum of an electron-donating polymer according to an Example 1.

FIG. 3 is an IR spectrum of an electron-donating polymer according to an Example 2.

FIG. 4 is an IR spectrum of an electron-donating polymer according to a Comparative Example 1.

FIG. 5 is an IR spectrum of an electron-donating polymer according to a Comparative Example 2.

FIG. 6 is a graph illustrating I-V curves of solar cells according to an Example 5, an Example 6 and Comparative Examples 4-6.

Figure 1:
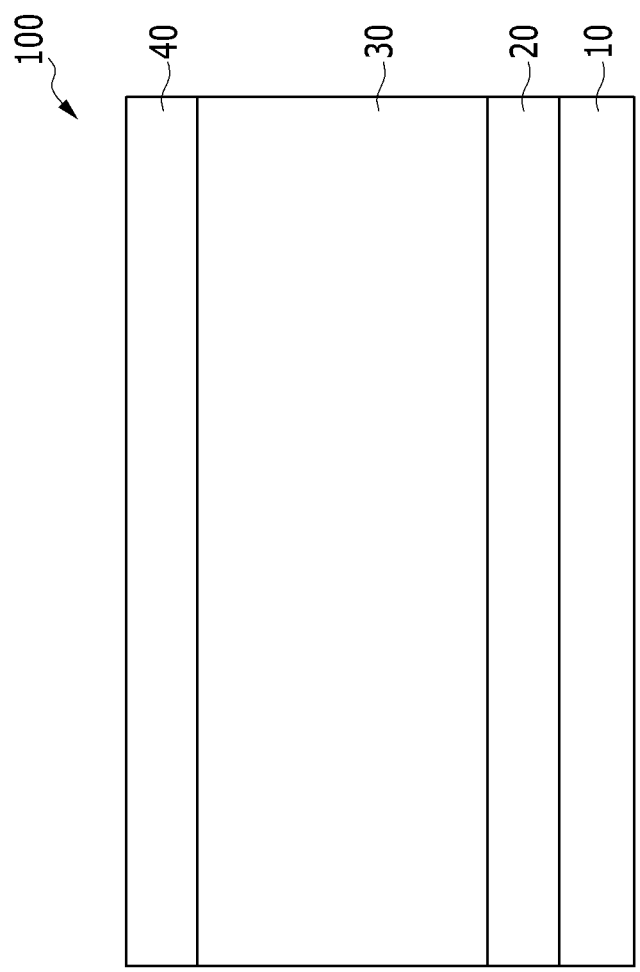
FIGS. 1-6 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, when a specific definition is not otherwise provided, the term "substituted" may refer to one substituted with at least one substituent selected from the group consisting of a halogen (F, Br, Cl, or I), a hydroxy group, a nitro group, a cyano group, an amino group (e.g., $NH_2$, $NH(R^{200})$, and/or $N(R^{201})(R^{202})$, $R^{200}$, $R^{201}$, and $R^{202}$ being the same or different, and are each independently a C1 to C10 alkyl group), an amidino group, a hydrazine group, a hydrazone group, a carboxyl group, a substituted or unsubstituted alkyl group, a substituted or unsubstituted haloalkyl group, a substituted or unsubstituted alkoxy group, a substituted or unsubstituted alkenyl group, a substituted or unsubstituted alkynyl group, a substituted or unsubstituted aryl group, a substituted or unsubstituted heteroaryl group, and a substituted or unsubstituted heterocycloalkyl group in place of at least one hydrogen of a functional group.

As used herein, when a specific definition is not otherwise provided, the term "aliphatic" may refer to C1 to C20 alkyl, a C2 to C20 alkenyl, a C2 to C20 alkynyl, a C1 to C20 alkylene, a C2 to C20 alkenylene, and/or a C2 to C20 alkynylene, and specifically a C1 to C15 an alkyl, a C2 to C15 alkenyl, a C2 to C15 alkynyl, a C1 to C15 alkylene, a C2 to C15 alkenylene, and/or a C2 to C15 alkynylene, and more specifically a C1 to C10 an alkyl, a C2 to C10 alkenyl, a C2 to C10 alkynyl, a C1 to C10 alkylene, a C2 to C10 alkenylene, and/or a C2 to C10 alkynylene, and the term "aromatic" may refer to a C6 to C30 aryl, a C2 to C30 heteroaryl, a C6 to C30 arylene, or a C2 to C30 heteroarylene, and specifically a C6 to C20 aryl, a C2 to C20 heteroaryl, a C6 to C20 arylene, and/or a C2 to C20 heteroarylene.

As used herein, when a specific definition is not otherwise provided, the term "heterocycloalkyl group", "heteroaryl group", and "heteroarylene group" may independently refer to a cycloalkyl group, an aryl group, and an arylene group including at least one heteroatom of N, O, S, Si, or P and remaining carbon in one cycle.

As used herein, when a specific definition is not otherwise provided, the term "alkyl group" may refer to a C1 to C20 alkyl group, specifically a C1 to C15 alkyl group, and more specifically a C1 to C10 alkyl group, the term "cycloalkyl group" may refer to a C3 to C20 cycloalkyl group, specifically a C3 to C15 cycloalkyl group, and more specifically a C3 to C10 cycloalkyl group, the term "alkylene group" may refer to a C1 to C20 alkylene group, specifically a C1 to C15 alkylene group, and more specifically a C1 to C10 alkylene group, the term "alkenyl group" may refer to a C2 to C20 alkenyl group, specifically a C2 to C15 alkenyl group, and more specifically a C2 to C10 alkenyl group, the term "alkenylene group" may refer to a C2 to C20 alkenylene group, specifically a C2 to C15 alkenylene group, and more specifically a C2 to C10 alkenylene group, the term "an alkynyl group" may refer to a C2 to C20 alkynyl group, specifically a C2 to C15 alkynyl group, and more specifically a C2 to C10 alkynyl group, the term "an alkynylene group" may refer to a C2 to C20 alkynylene group, specifically a C2 to C15 alkynylene group, and more specifically a C2 to C10 alkynylene group, the term "alkoxy group" may refer to a C1 to C20 alkoxy group, specifically a C1 to C15 alkoxy group, and more specifically a C1 to C10 alkoxy group, the term "ester group" may refer to a C1 to C20 ester group, specifically a C1 to C15 ester group, and more specifically a C1 to C10 ester group, the term "aryl group" may refer to a C6 to C30 aryl group, specifically a C6 to C20 aryl group, and more specifically a C6 to C15 an aryl group, the term "heterocycloalkyl group" may refer to a C2 to C30 heterocycloalkyl group, specifically a C2 to C20 heterocycloalkyl group, and the term "halogen" may refer to F, Cl, Br, or I.

As used herein, when a definition is not otherwise provided, "combination" commonly may refer to mixing or copolymerization. Herein, "copolymerization" may refer to block copolymerization, random copolymerization, or graft copolymerization, and the term "copolymer" may refer to a block copolymer, a random copolymer, or a graft copolymer. In addition, in the specification, the mark "*" may refer to where something is connected with the same or different atom or chemical formula.

An electron-donating polymer according to example embodiments may include a repeating unit A. The repeating unit A may include a repeating unit represented by the following Chemical Formula 1, and at least one of repeating units represented by the following Chemical Formulae 2-4.

[Chemical Formula 1]

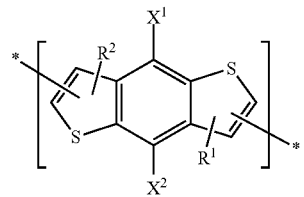

In Chemical Formula 1, $X^1$ and $X^2$ are the same or different, and each may independently be at least one of hydrogen, a halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, and $SR^{100}$. $R^{100}$ may be at least one of a substituted or unsubstituted C1 to C20 aliphatic organic group, a substituted or unsubstituted C2 to C30 aromatic organic group, and a substituted or unsubstituted C2 to C30 heterocycloalkyl group. According to example embodiments, $R^{100}$ may be a substituted or unsubstituted C1 to C20 alkyl group. When $X^1$ and $X^2$ include an alkenyl group and/or an alkynyl group, $X^1$ and $X^2$ may include one or two carbon-carbon unsaturated bonds, for example, a carbon-carbon double bond and a carbon-carbon triple bond.

According to at least one example embodiment, $X^1$ and $X^2$ are the same or different, and each may independently be at least one of a substituted or unsubstituted C1 to C20 alkyl group, a substituted or unsubstituted C1 to C20 alkoxy group, a substituted or unsubstituted C1 to C20 ester group, and —$SR^{100}$. $R^{100}$ may be at least one of a substituted or unsubstituted C1 to C20 alkyl group, and a substituted or unsubstituted C2 to C30 heterocycloalkyl group.

According to at least one example embodiment, $R^1$ and $R^2$ are the same or different, and each may independently be at least one of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof, or at least one $CH_2$ group included in the $R^1$ and $R^2$ may be substituted with at least one of —O—, —S—, —SO$_2$—, —CO—, —OCO—, —COO—, —CH=CH—, —C≡C—, and —SiR$^{101}$R$^{102}$. According to example embodiments, R$^{101}$ and R$^{102}$ are the same or different, and each may independently be at least one of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof. R$^1$ and R$^2$ are the same or different, and each may independently be at least one of hydrogen and a substituted or unsubstituted C1 to C20 alkyl group.

[Chemical Formula 2]

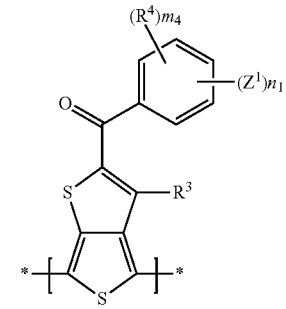

[Chemical Formula 3]

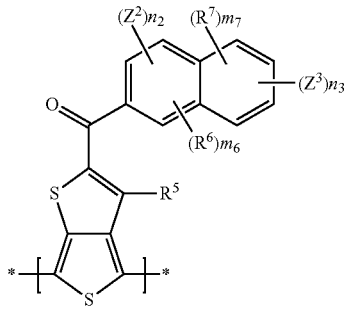

[Chemical Formula 4]

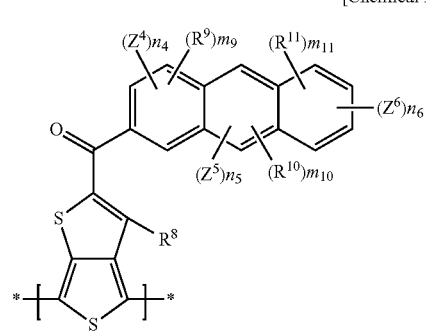

In Chemical Formulae 2-4, Z$^1$ to Z$^6$ are the same or different, and each may independently be at least one of hydrogen and an electron withdrawing group. The electron withdrawing group may be at least one of —CF$_3$, —CCl$_3$, —CBr$_3$, —Cl$_3$, —F, —Cl, —Br, —I, —NO$_2$, —NO, —CN, —COCH$_3$, —CO$_2$C$_2$H$_5$, —SO$_3$, —SO$_3$R$^{106}$ (R$^{106}$ being the same or different in each repeating unit, and may independently be at least one of hydrogen and a substituted or unsubstituted C1 to C20 aliphatic organic group), a residual group derived from a metal sulfonate (the metal may be at least one of a Group 1 metal and a Group 2 metal), and a C2 to C30 aromatic organic group. The Group 1 metal may be at least one of lithium (Li), sodium (Na), potassium (K), rubidium (Rb), cesium (Cs), and francium (Fr), and in one embodiment at least one of sodium (Na) and potassium (K) may be desirable. The Group 2 metal may be at least one of beryllium (Be), magnesium (Mg), calcium (Ca), strontium (Sr), barium (Ba), and radium (Ra), and according to at least one example embodiment calcium (Ca) may be desirable.

According to at least one example embodiment, Z$^1$ to Z$^6$ are the same or different, and each may independently be at least one of hydrogen, —SO$_3$R$^{106}$ (R$^{106}$ being the same or different in each repeating unit, and may independently be at least one of hydrogen, and a substituted or unsubstituted C1 to C20 aliphatic organic group), a halogen, —NO$_2$, —NO, and —CN. According to example embodiments, n$_1$ may be an integer ranging from 1 to 5, inclusive, and for example 1 or 2. According to example embodiments, n$_2$ may be an integer ranging from 0 to 3, inclusive, n$_3$ may be an integer ranging from 0 to 4, inclusive, and n$_2$+n$_3$ may be an integer ranging from 1 to 5, inclusive. For example, n$_2$ may be an integer ranging from 0 to 2, inclusive, n$_3$ may be an integer ranging from 0 to 2, inclusive, and n$_2$+n$_3$ may be an integer of 1 or 2.

According to example embodiments, n$_4$ may be an integer ranging from 0 to 3, inclusive, n$_5$ may be an integer ranging from 0 to 2, inclusive, n$_6$ may be an integer ranging from 0 to 4, inclusive, and n$_4$+n$_5$+n$_6$ may be an integer ranging from 1 to 5, inclusive. For example, n$_4$ may be an integer ranging from 0 to 2, inclusive, n$_5$ may be an integer ranging from 0 to 2, inclusive, n$_6$ may be an integer ranging from 0 to 2, inclusive, and n$_4$+n$_5$+n$_6$ may be an integer of 1 or 2.

R$^4$, R$^6$, R$^7$, and R$^9$ to R$^{11}$ are the same or different, and each may independently be at least one of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof, or at least one CH$_2$ group included in the R$^4$, R$^6$, R$^7$, and R$^9$ to R$^{11}$ may be substituted with at least one of —O—, —S—, —SO$_2$—, —CO—, —OCO—, —COO—, —CH=CH—, —C≡C—, and —SiR$^{103}$R$^{104}$ (R$^{103}$ and R$^{104}$ being the same or different, and each may independently be at least one of hydrogen, a substituted or unsubstituted C1 to C20 linear or branched alkyl group, a substituted or unsubstituted C3 to C20 cycloalkyl group, a substituted or unsubstituted C1 to C20 alkoxy group, a substituted or unsubstituted C6 to C30 aryl group, a substituted or unsubstituted C2 to C30 heteroaryl group, and a combination thereof). For example, the R$^4$, R$^6$, R$^7$, and R$^9$ to R$^{11}$ are the same or different, and each may independently be at least one of hydrogen and a substituted or unsubstituted C1 to C20 alkyl group.

R$^3$, R$^5$, and R$^8$ are the same or different, and each may independently be at least one of hydrogen, a halogen, a substituted or unsubstituted C1 to C20 aliphatic organic group, hydroxy group, a substituted or unsubstituted C1 to C20 alkoxy group, a substituted or unsubstituted C1 to C20 ester group, a thiol group, and —SR$^{105}$. According to example embodiments, R$^{105}$ may be at least one of a substituted or unsubstituted C1 to C20 aliphatic organic group, a substituted or unsubstituted C2 to C30 aromatic organic group, and a substituted or unsubstituted C2 to C30 heterocycloalkyl group.

For example, the R$^3$, R$^5$, and R$^8$ are the same or different, and each may independently be one of hydrogen and a halogen. According to example embodiments, m$_4$ is the same or different in each repeating unit, and each may independently be an integer ranging from 0 to 5, inclusive. According to example embodiments, $m_6$ and $m_9$ may each independently be an integer ranging from 0 to 3, inclusive, $m_7$ and $m_{11}$ may each independently be integers ranging from 0 to 4, inclusive, and $m_{10}$ is the same or different in each repeating unit, and each may independently be an integer ranging from 0 to 2, inclusive.

In an electron-donating polymer according to example embodiments, a repeating unit represented by Chemical Formula 1 may act as an electron-donating group that provides electrons. For example, the repeating unit represented by Chemical Formula 1 may include repeating units represented by at least one of the following Chemical Formulae 5-1 to 5-10, and a combination thereof, but is not limited thereto.

[Chemical Formula 5-1]

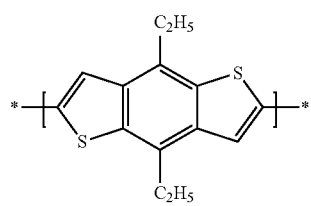

[Chemical Formula 5-2]

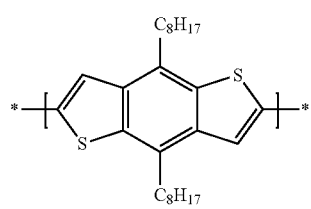

[Chemical Formula 5-3]

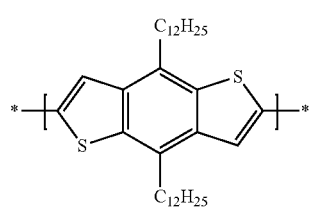

[Chemical Formula 5-4]

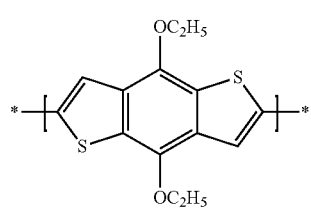

[Chemical Formula 5-5]

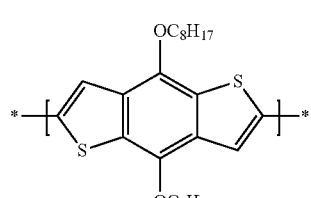

[Chemical Formula 5-6]

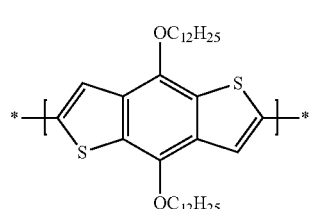

[Chemical Formula 5-7]

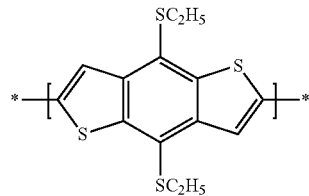

[Chemical Formula 5-8]

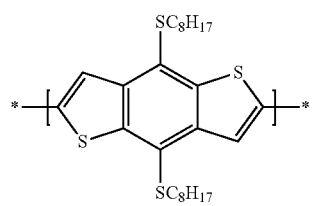

[Chemical Formula 5-9]

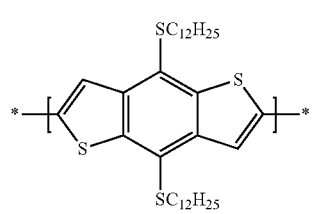

[Chemical Formula 5-10]

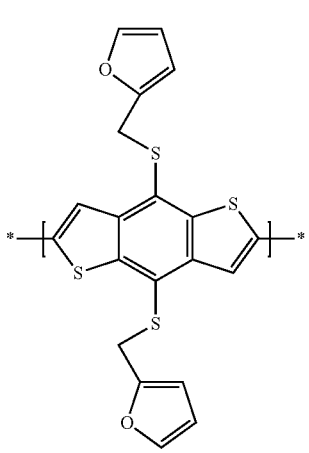

In an electron-donating polymer according to example embodiments, the repeating units represented by Chemical Formulae 2-4 may include a substituted or unsubstituted C2 to C30 aromatic organic group with a planar structure. The electron-donating polymer may enhance the open circuit voltage ($V_{oc}$) and reduce the bandgap by the electron withdrawing effect of an aromatic organic group. It may also absorb solar light with a wider wavelength region. An increasing interaction between the polymers may improve the stacking structure to increase the hole mobility, and may improve the short circuit current density ($J_{sc}$).

In an electron-donating polymer according to example embodiments, the repeating units represented by Chemical Formulae 2-4 may include an electron withdrawing group connected to the aromatic organic group with a planar structure, for example, an electron accepting functional group. The electron withdrawing group may increase the open circuit voltage ($V_{oc}$) by decreasing the lowest unoccupied molecular orbital (LUMO) level and the highest occupied molecular orbital (HOMO) level of the electron-donating polymer. When an electron-donating polymer according to example embodiments is used in an organic solar cell, it may effectively improve the photoelectric conversion efficiency of the organic solar cell.

For example, the repeating units represented by Chemical Formulae 2-4 may include repeating units represented by the following Chemical Formulae 6-1 to 6-6, but are not limited thereto.

[Chemical Formula 6-1]

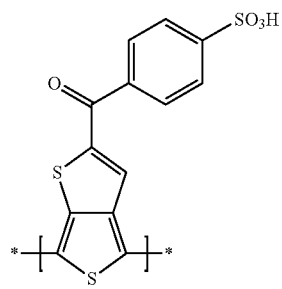

[Chemical Formula 6-2]

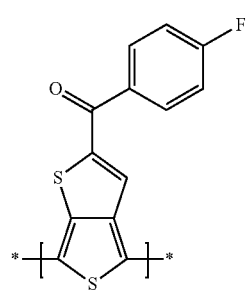

[Chemical Formula 6-3]

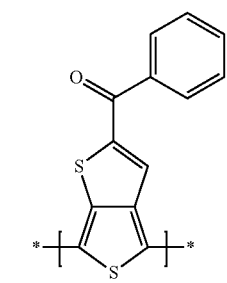

[Chemical Formula 6-4]

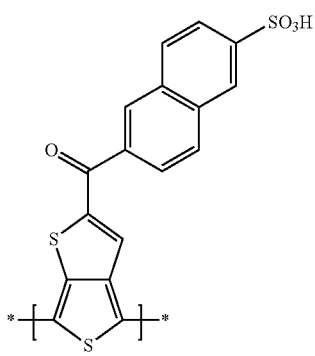

[Chemical Formula 6-5]

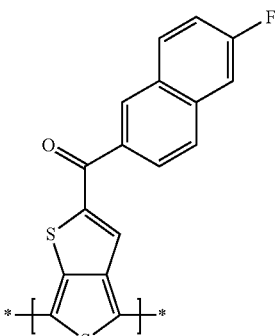

[Chemical Formula 6-6]

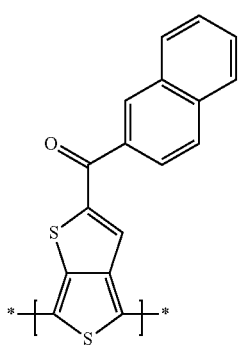

For example, in an electron-donating polymer according to example embodiments, the repeating unit A may include repeating units represented by at least one of the following Chemical Formulae 7-1 to 7-3, and a combination thereof, but are not limited thereto.

[Chemical Formula 7-1]

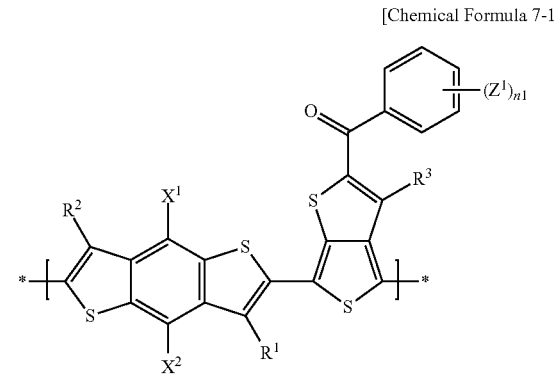

[Chemical Formula 7-2]

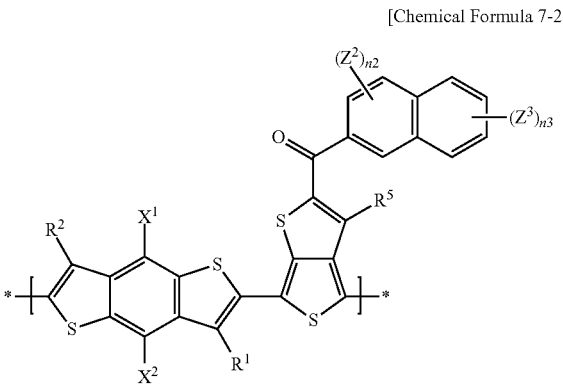

[Chemical Formula 7-3]

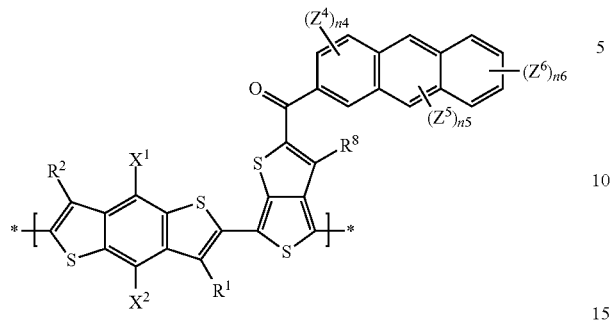

In Chemical Formulae 7-1 to 7-3, $X^1$ and $X^2$ are the same or different, and each may independently be at least one of a substituted or unsubstituted C1 to C20 alkyl group, a substituted or unsubstituted C1 to C20 alkoxy group, a substituted or unsubstituted C1 to C20 ester group, and —$SR^{100}$. According to example embodiments, $R^{100}$ may be at least one of a substituted or unsubstituted C1 to C20 alkyl group and a substituted or unsubstituted C2 to C30 heterocycloalkyl group. For example, $X^1$ and $X^2$ are the same or different, and each may independently be a substituted or unsubstituted C1 to C20 alkoxy group.

According to example embodiments, $R^1$ and $R^2$ are the same or different, and each may independently be at least one of hydrogen, and a substituted or unsubstituted C1 to C20 alkyl group. For example, $R^1$ and $R^2$ may be hydrogen. According to example embodiments, $R^3$, $R^5$, and $R^8$ are the same or different, and each may independently be at least one of hydrogen and a halogen. For example, $R^3$, $R^5$, and $R^8$ may be hydrogen. According to example embodiments, $Z^1$ to $Z^6$ are the same or different, and each may independently be at least one of hydrogen, —$SO_3R^{106}$ ($R^{106}$ being the same or different in each repeating unit, and may independently be at least one of hydrogen, and a substituted or unsubstituted C1 to C20 aliphatic organic group), a halogen, —$NO_2$, —NO, and —CN.

According to example embodiments, n1 may be an integer of 1 or 2, n2 may be an integer ranging from 0 to 2, inclusive, n3 may be an integer ranging from 0 to 2, inclusive, n2+n3 may be an integer of 1 or 2, n4 may be an integer ranging from 0 to 2, inclusive, n5 may be an integer ranging from 0 to 2, inclusive, n6 may be an integer ranging from 0 to 2, inclusive, and n4+n5+n6 may be an integer of 1 or 2.

For example, in an electron-donating polymer according to example embodiments, the repeating unit A may include at least one of repeating units represented by the following Chemical Formulae 8-1 to 8-18, and a combination thereof, but is not limited thereto.

[Chemical Formula 8-1]

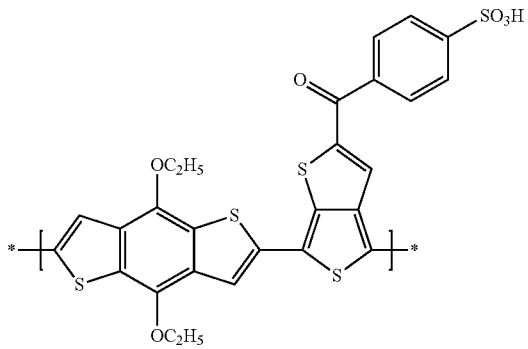

[Chemical Formula 8-2]

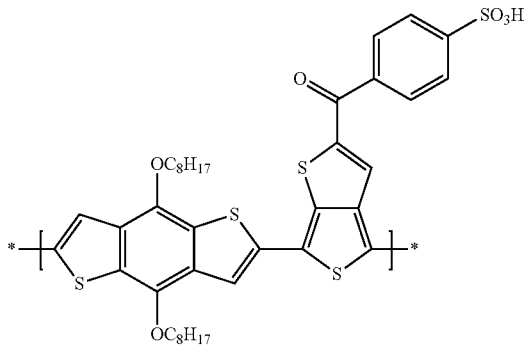

[Chemical Formula 8-3]

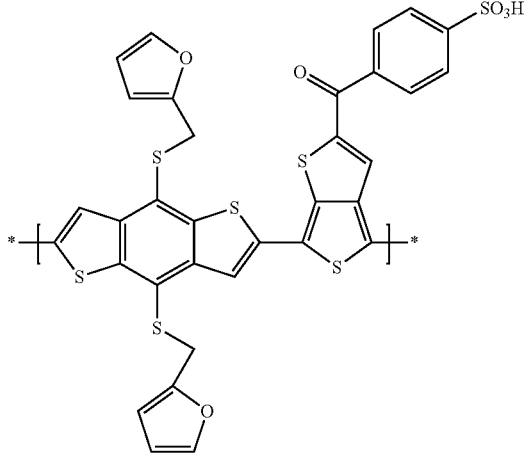

[Chemical Formula 8-4]

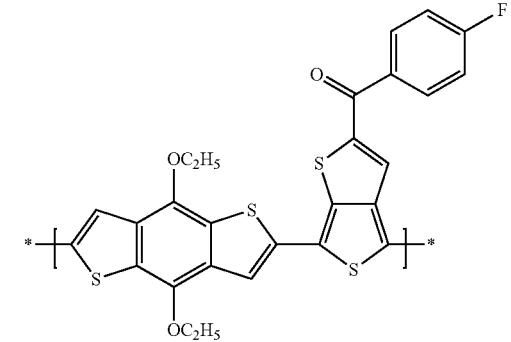

[Chemical Formula 8-5]
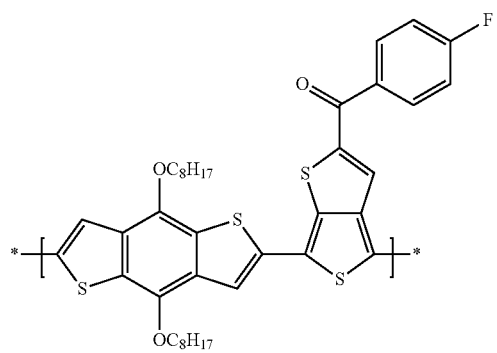
[Chemical Formula 8-6]
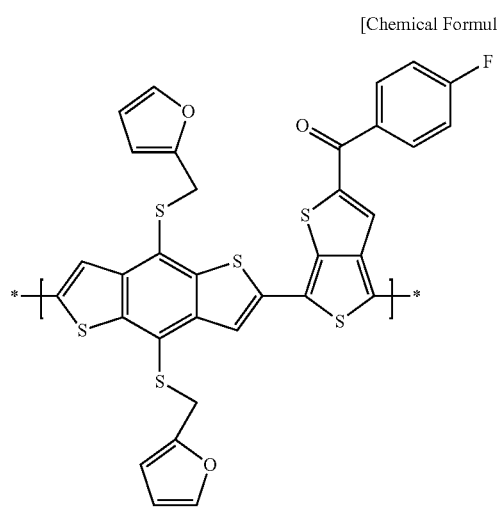
[Chemical Formula 8-7]
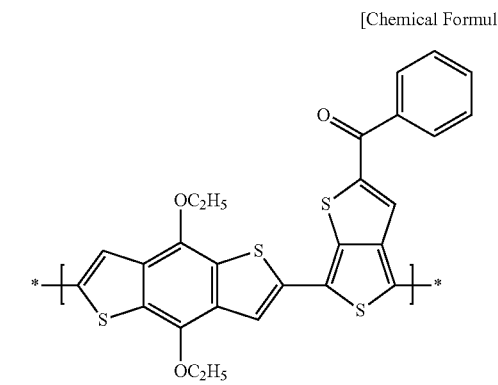
[Chemical Formula 8-8]
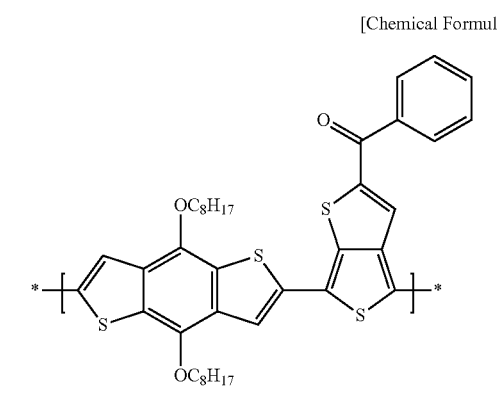
[Chemical Formula 8-9]
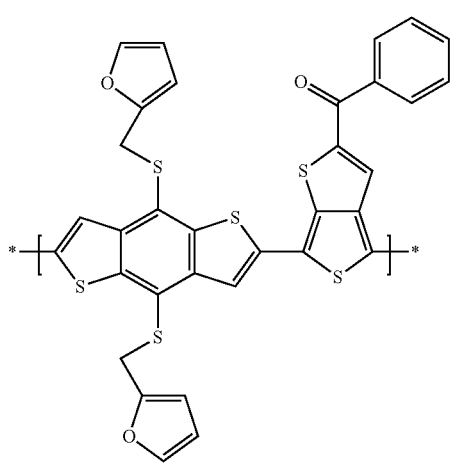
[Chemical Formula 8-10]
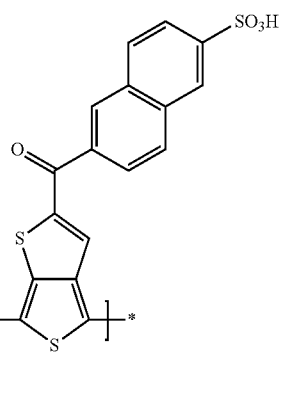
[Chemical Formula 8-11]
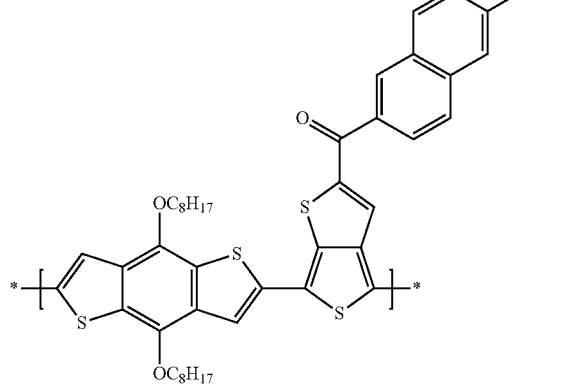

23
-continued
[Chemical Formula 8-12]
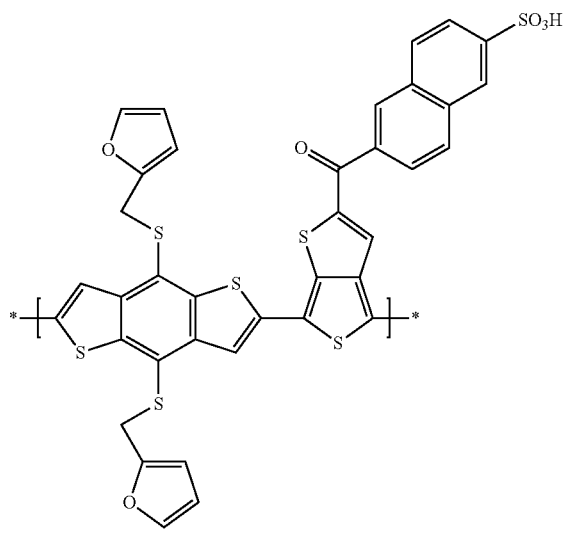
[Chemical Formula 8-13]
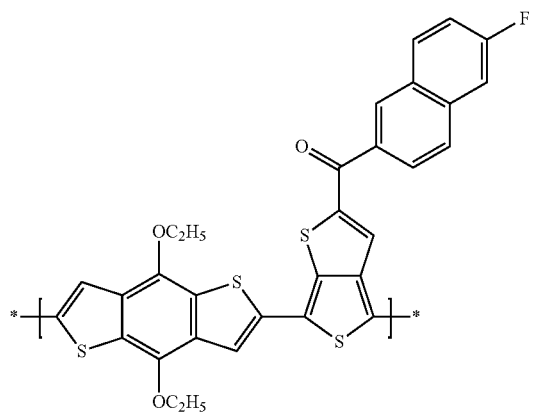
[Chemical Formula 8-14]
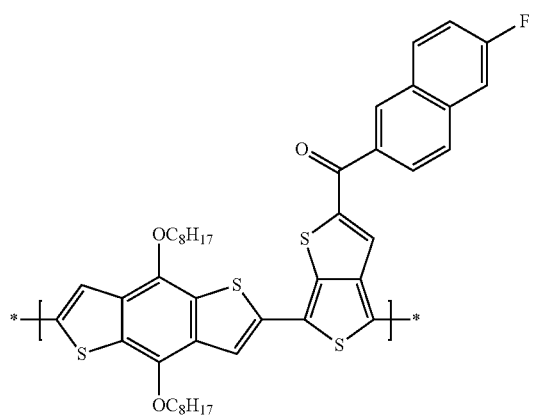
24
-continued
[Chemical Formula 8-15]
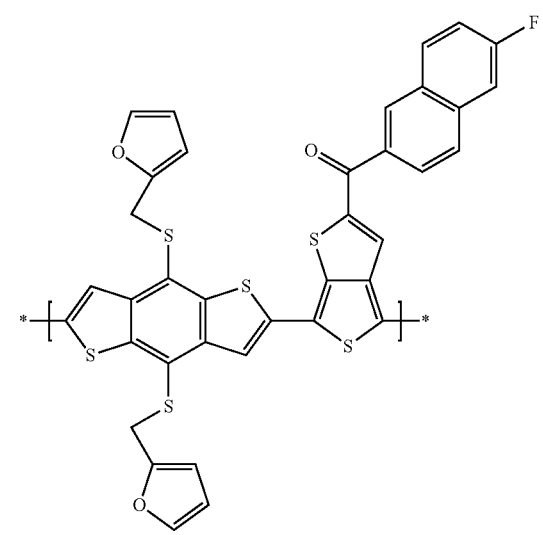
[Chemical Formula 8-16]
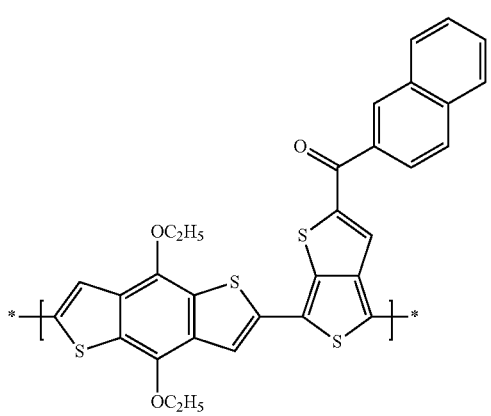
[Chemical Formula 8-17]
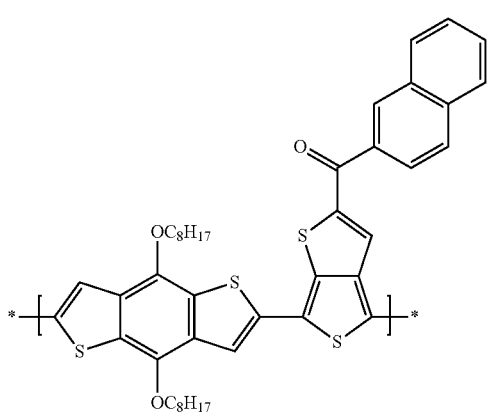

[Chemical Formula 8-18]

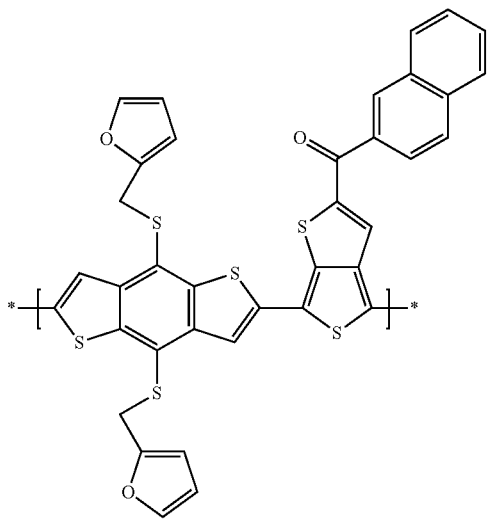

An electron-donating polymer according to example embodiments may include a repeating unit represented by Chemical Formula 1 and at least one of repeating units represented by Chemical Formulae 2-4 at a mole ratio of about 1:1 to about 1:1.4. When the repeating units are included within a mole ratio of about 1:1 to about 1:1.4, a molecular weight of the electron-donating polymer may be effectively controlled. The electron-donating polymer may be easily prepared using a solution process. Particularly, the electron-donating polymer may include a repeating unit represented by Chemical Formula 1 and at least one of repeating units represented by Chemical Formulae 2-4 at a mole ratio of about 1:1.002 to about 1:1.2.

The electron-donating polymer may have a number average molecular weight of about 1000 to about 800,000. When an average molecular weight of an electron-donating polymer is about 1000 to about 800,000, composition of a solution for preparing the electron-donating polymer may be easily controlled. Properties of the electron-donating polymer may be effectively controlled. The electron-donating polymer may be easily processed, and easily applied to an organic solar cell. A number average molecular of the electron-donating polymer may be about 2000 to about 100,000, and for example, about 5000 to about 50,000.

A bandgap of the electron-donating polymer may be about 1.2 eV to about 2.5 eV. When a bandgap of the electron-donating polymer is about 1.2 eV to about 2.5 eV, the electron-donating polymer may effectively absorb solar light in a wide wavelength region and increase short circuit current density ($J_{sc}$), effectively improving efficiency of an organic solar cell. For example, a bandgap of the electron-donating polymer may be about 1.2 eV to about 2.1 eV, (e.g., about 1.2 eV to about 1.9 eV).

The electron-donating polymer according to other example embodiments may include a repeating unit A with a repeating unit represented by Chemical Formula 1 and at least one of the repeating units represented by Chemical Formulae 2-4, and may include a repeating unit B with a repeating unit represented by Chemical Formula 1 and a repeating unit represented by Chemical Formula 9. In an electron-donating polymer according to example embodiments, the repeating unit A and the repeating unit B may be copolymerized with each other.

Hereinafter, when otherwise description is not provided, Chemical Formula 1, Chemical Formulae 2-4, and a repeating unit A may be the same as described above.

[Chemical Formula 9]

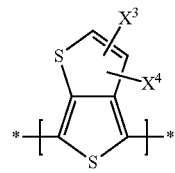

In Chemical Formula 9, $X^3$ may be the same or different in each repeating unit, and each may independently be an electron-accepting group including two ester residual groups and a substituted or unsubstituted divalent aliphatic organic group linking the ester residual groups. According to example embodiments, $X^4$ is the same or different in each repeating unit, and each may independently be at least one of hydrogen, a halogen, a substituted or unsubstituted C1 to C20 aliphatic organic group, a hydroxy group, a substituted or unsubstituted C1 to C20 alkoxy group, a substituted or unsubstituted C1 to C20 ester group, a thiol group, and —$SR^{107}$. According to example embodiments, $R^{107}$ may be a substituted or unsubstituted C1 to C20 aliphatic organic group, a substituted or unsubstituted C2 to C30 aromatic organic group, and a substituted or unsubstituted C2 to C30 heterocycloalkyl group, for example, a substituted or unsubstituted C1 to C20 alkyl group.

When $X^3$ and $X^4$ include an alkenyl group and/or an alkynyl group, $X^3$ and $X^4$ may include one or two carbon-carbon unsaturated bonds, for example, a carbon-carbon double bond and a carbon-carbon triple bond. For example, a repeating unit represented by Chemical Formula 9 may include a repeating unit represented by the following Chemical Formula 9-1, a repeating unit represented by Chemical Formula 9-2, or a combination thereof.

[Chemical Formula 9-1]

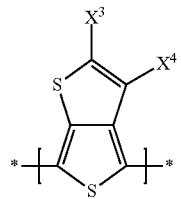

[Chemical Formula 9-2]

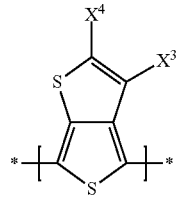

In Chemical Formulae 9-1 and 9-2, $X^3$ is the same or different in each repeating unit, and each may independently be an electron-accepting group including two ester residual groups and a substituted or unsubstituted divalent aliphatic organic group linking the ester residual groups. According to example embodiments, $X^4$ is the same or different in each repeating unit, and each may independently be at least one of hydrogen, a halogen, and a substituted or unsubstituted C1 to C20 alkyl group. For example, $X^4$ may be hydrogen.

The repeating unit represented by Chemical Formula 9 included in the repeating unit B may act as a compatibilizer. The repeating unit represented by Chemical Formula 9 may include an electron-accepting group including two ester residual groups and a substituted or unsubstituted divalent aliphatic organic group linking the ester residual groups. The electron-donating polymer may improve the miscibility with the electron acceptor, so as to effectively improve the morphology of the photoactive layer, and may easily separate electrons from holes and prevent the recombination of electrons and holes. When an electron-donating polymer according to example embodiments is used in an organic solar cell, it may enhance the fill factor (FF) of the organic solar cell to improve the photoelectric conversion efficiency.

In a repeating unit B, the substituted or unsubstituted divalent aliphatic organic group included in the repeating unit represented by Chemical Formula 9 may be hydrophobic, and the ester residual group may be hydrophilic and/or polar. The electron-donating polymer may be effectively dissolved in the various solvents, so as to easily provide a photoactive layer. In a repeating unit B, the repeating unit represented by Chemical Formula 9 may include the electron-accepting group, so it may have a lower lowest unoccupied molecular orbital (LUMO) level than the polymer including no electron-accepting group and a similar highest occupied molecular orbital (HOMO) level to the same. The electron-donating polymer may have a lower bandgap and absorb solar light having a wider wavelength region than the polymer including no electron-accepting group.

For example, the electron-accepting group including two ester residual groups and a substituted or unsubstituted divalent aliphatic organic group linking the ester residual groups may include a functional group represented by the following Chemical Formula 10-1 or 10-2, but is not limited thereto.

[Chemical Formula 10-1]

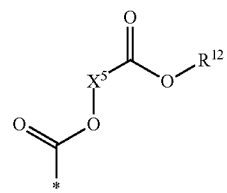

[Chemical Formula 10-2]

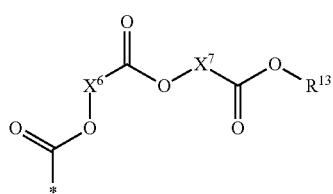

In Chemical Formulae 10-1 and 10-2, $X^5$ to $X^7$ are the same or different, and each may independently be a substituted or unsubstituted divalent C1 to C20 aliphatic organic group. According to example embodiments, $X^5$ to $X^7$ may be a substituted or unsubstituted divalent C1 to C20 alkylene group, for example, a substituted or unsubstituted divalent C1 to C10 alkylene group. $R^{12}$ and $R^{13}$ are the same or different, and each may independently be at least one of hydrogen, and a substituted or unsubstituted C1 to C20 aliphatic organic group. For example, $R^{12}$ and $R^{13}$ may be at least one hydrogen, and a substituted or unsubstituted C1 to C20 alkyl group (e.g., a substituted or unsubstituted C1 to C10 alkyl group). According to example embodiments, $R^{12}$ and $R^{13}$ may be, for example, at least one of hydrogen, and a substituted or unsubstituted C1 to C6 alkyl group.

For example, the repeating unit represented by Chemical Formula 9 may include a repeating unit represented by the following Chemical Formula 11-1, a repeating unit represented by the following Chemical Formula 11-2, or a combination thereof, but is not limited thereto.

[Chemical Formula 11-1]

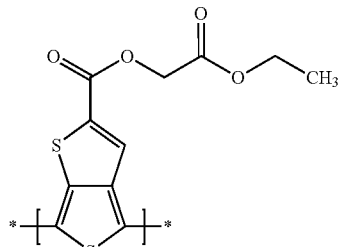

[Chemical Formula 11-2]

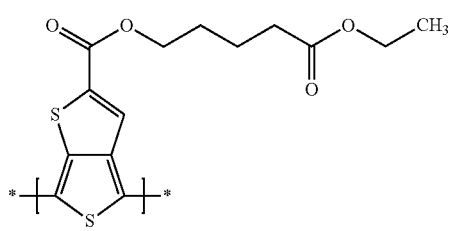

For example, the repeating unit B may include a repeating unit represented by the following Chemical Formula 12.

[Chemical Formula 12]

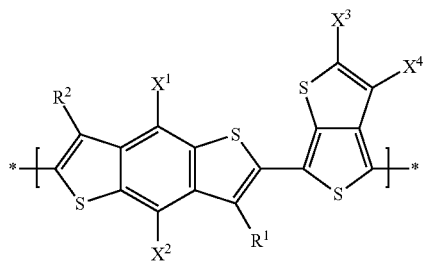

In Chemical Formula 12, $X^1$ and $X^2$ are the same or different, and each may independently be at least one of a substituted or unsubstituted C1 to C20 alkyl group, a substituted or unsubstituted C1 to C20 alkoxy group, a substituted or unsubstituted C1 to C20 ester group, and $—SR^{100}$. According to example embodiments, $R^{100}$ may be at least one of a substituted or unsubstituted C1 to C20 alkyl group, and a substituted or unsubstituted C2 to C30 heterocycloalkyl group, for example, a substituted or unsubstituted C1 to C20 alkoxy group. According to example embodiments, $R^1$ and $R^2$ are the same or different, and each may independently be at least one of hydrogen, and an a substituted or unsubstituted C1 to C20 alkyl group, for example, hydrogen.

According to example embodiments, $X^3$ is the same or different in each repeating unit, and each may independently be an electron-accepting group including two ester residual groups and a substituted or unsubstituted divalent aliphatic organic group linking the ester residual groups. According to example embodiments, $X^4$ is the same or different in each repeating unit, and each may independently be at least one of hydrogen, a halogen, and a substituted or unsubstituted C1 to C20 alkyl group, for example, hydrogen.

For example, the repeating unit B may include repeating units represented by the following Chemical Formulae 13-1 to 13-6, or a combination thereof, but is not limited thereto.

[Chemical Formula 13-1]

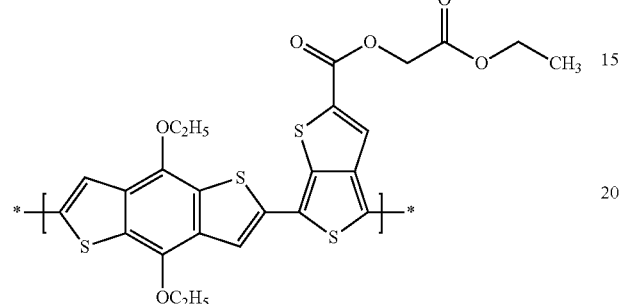

[Chemical Formula 13-2]

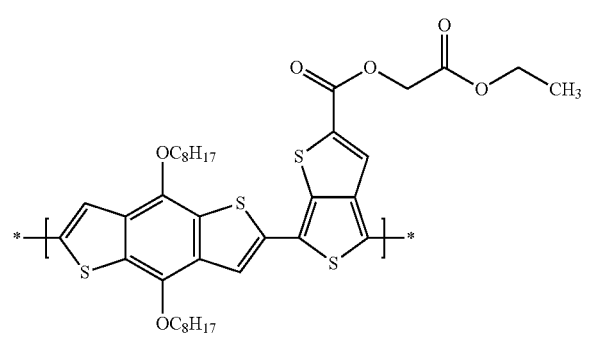

[Chemical Formula 13-3]

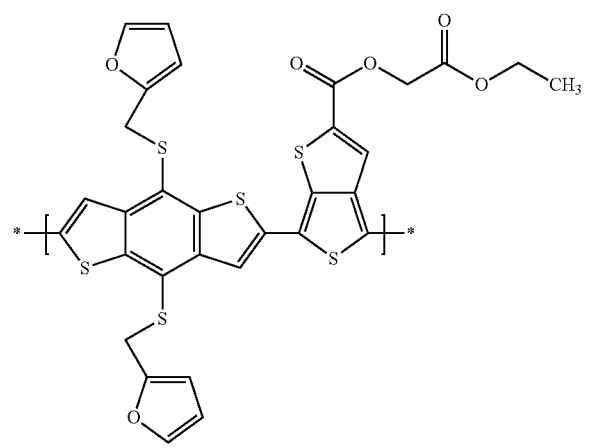

[Chemical Formula 13-4]

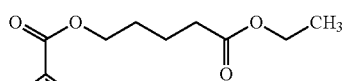

[Chemical Formula 13-5]

[Chemical Formula 13-6]

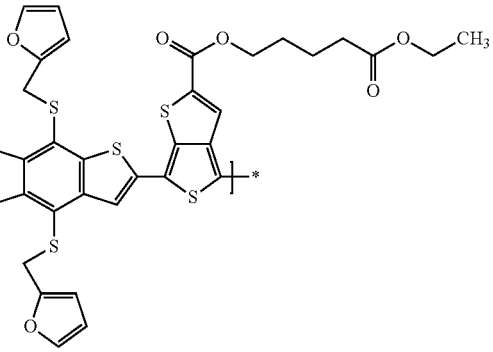

When the electron-donating polymer includes both the repeating unit A and the repeating unit B, the electron-donating polymer may include the repeating unit A and the repeating unit B at a mole ratio of about 1:10 to about 10:1. When the repeating units A and B are included at the mole ratio of about 1:10 to about 10:1, a bandgap and a number average molecular weight of the electron-donating polymer may be effectively controlled. The electron-donating polymer may be easily prepared using a solution process. Phase separation may not occur in the electron-donating polymer, and it may improve the morphology by using the electron-donating polymer and uniformly mixing it with the electron-acceptor to provide a photoactive layer. For example, the electron-donating polymer may include the repeating unit A and the repeating unit B at a mole ratio of about 1:5 to about 5:1.

A number average molecular weight of the electron-donating polymer may be about 1000 to about 800,000. When a number average molecular weight of an electron-donating polymer is about 1000 to about 800,000, composition of a solution for preparing the electron-donating polymer may be easily controlled. Properties of the electron-donating polymer may be effectively controlled. The electron-donating polymer may be easily processed, and easily applied to an organic solar cell. A number average molecular weight of the electron-donating polymer may be about 2000 to about 100,000, for example, about 5000 to about 50,000.

A bandgap of the electron-donating polymer may be about 1.2 eV to about 2.5 eV. When a bandgap of the electron-donating polymer is about 1.2 eV to about 2.5 eV, the electron-donating polymer may effectively absorb solar light in a wide wavelength region and increase short circuit current density ($J_{sc}$), and may effectively improve efficiency of an organic solar cell. A bandgap of the electron-donating polymer may about 1.2 eV to about 2.1 eV, for example, about 1.2 eV to about 1.9 eV.

FIG. 1 is a cross-sectional diagram illustrating organic solar cells according to example embodiments. Referring to FIG. 1, an organic solar cell 100 according to at least one example embodiment may include a substrate 10, a lower electrode 20 on at least one surface of the substrate 10, a photoactive layer 30 on at least one surface of the lower electrode 20, and an upper electrode 40 on at least one surface of the photoactive layer 30. The substrate 10 may include a transmitting material, for example, an inorganic material. The substrate 10 may include, for example, glass and/or an organic material (e.g., polycarbonate, polymethylmethacrylate, polyethylene terephthalate, polyethylene naphthalate, polyamide, and/or polyethersulfone).

One of the lower electrode 20 and the upper electrode 40 may be an anode, and the other may be a cathode. Either of the lower electrode 20 and the upper electrode 40 may include a transparent conductor, for example, indium tin oxide (ITO), indium-doped zinc oxide (IZO), tin oxide ($SnO_2$), aluminum-doped zinc oxide (AZO), gallium-doped zinc oxide (GZO), and/or the like, while the other may include an opaque conductor, for example, aluminum (Al), silver (Ag), gold (Au), lithium (Li), and/or the like. The photoactive layer 30 may include an electron acceptor made of an n-type semiconductor material and an electron donor made of a p-type semiconductor material.

The electron acceptor may include, for example, fullerene with a large electron affinity (C60, C70, C74, C76, C78, C82, C84, C720, C860, and/or the like), fullerene derivatives (e.g., 1-(3-methoxy-carbonyl)propyl-1-phenyl(6,6)C61 (PCBM), C71-PCBM, C84-PCBM, bis-PCBM, and/or the like), perylene, an inorganic semiconductor (e.g., CdS, CdTe, CdSe, ZnO, and/or the like) and/or a combination thereof. The electron donor may include an electron-donating polymer according to example embodiments described above. When an electron-donating polymer according to example embodiments is included, the organic solar cell may have a higher short circuit current density ($J_{sc}$) and open circuit voltage ($V_{oc}$) than a conventional organic solar cell and improved hole mobility. The organic solar cell may have excellent photoelectric conversion efficiency.

The electron acceptor and the electron donor may have, for example, a bulk heterojunction structure. The bulk heterojunction structure may generate a photocurrent by diffusing a pair of electron-holes excited by light absorbed in the photoactive layer 30 into an interface between the electron acceptor and the electron donor, separating the pair of electron-holes into electrons and holes due to an electronic affinity difference of the two materials at the interface, and moving the electrons through the electron acceptor to the cathode and the holes through the electron donor to the anode.

Hereinafter, specific non-limiting examples of some example embodiments are described.

EXAMPLES

Example 1

Preparation of an Electron-Donating Polymer

An electron-donating polymer may be prepared according to the following Reaction Scheme 1.

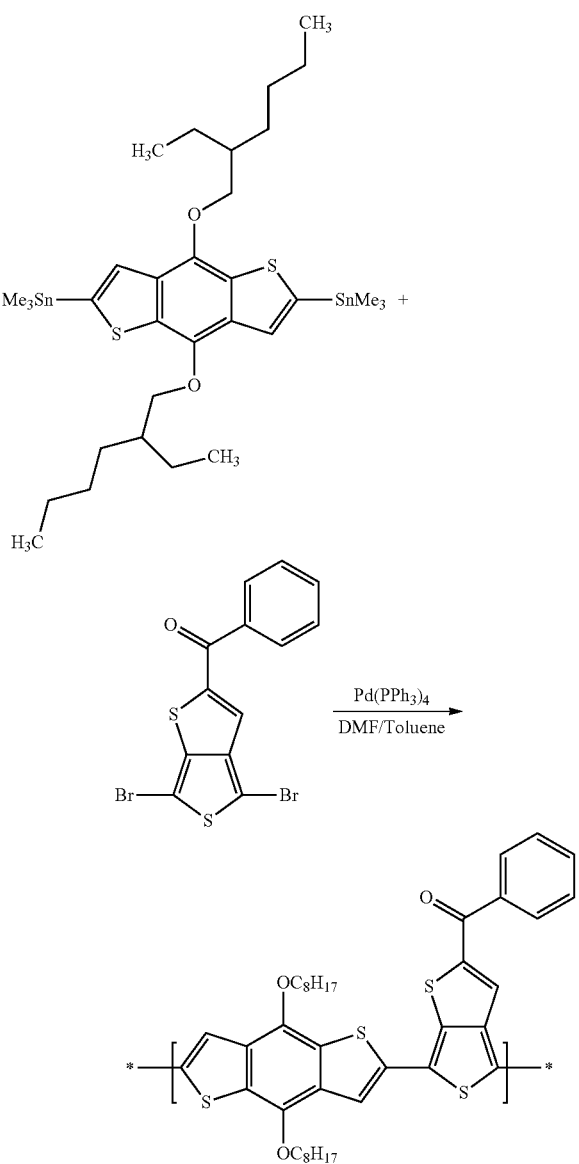

[Reaction Scheme 1]

According to at least one example embodiment, about 0.250 mmol of 2,6-bis(trimethyl tin)-1,8-bis((2-ethylhexyl)oxy)benzo[1,2-b:4,5-b']dithiophene and about 0.250 mmol of 4,6-dibromothieno[3,4-b]thiophen-2-yl(phenyl)methanone may be added into about 5 ml of DMF/toluene (dimethylformamide/toluene) (volume ratio=1:4), added with a catalyst of about 0.010 mmol of $Pd(PPh_3)_4$ and agitated at a temperature of about 120° C. for about 6 hours to provide an electron-donating polymer. A number average molecular weight of the electron-donating polymer may be about 14,000.

Example 2

Preparation of an Electron-Donating Polymer

An electron-donating polymer may be prepared according to the following Reaction Scheme 2.

[Reaction Scheme 2]

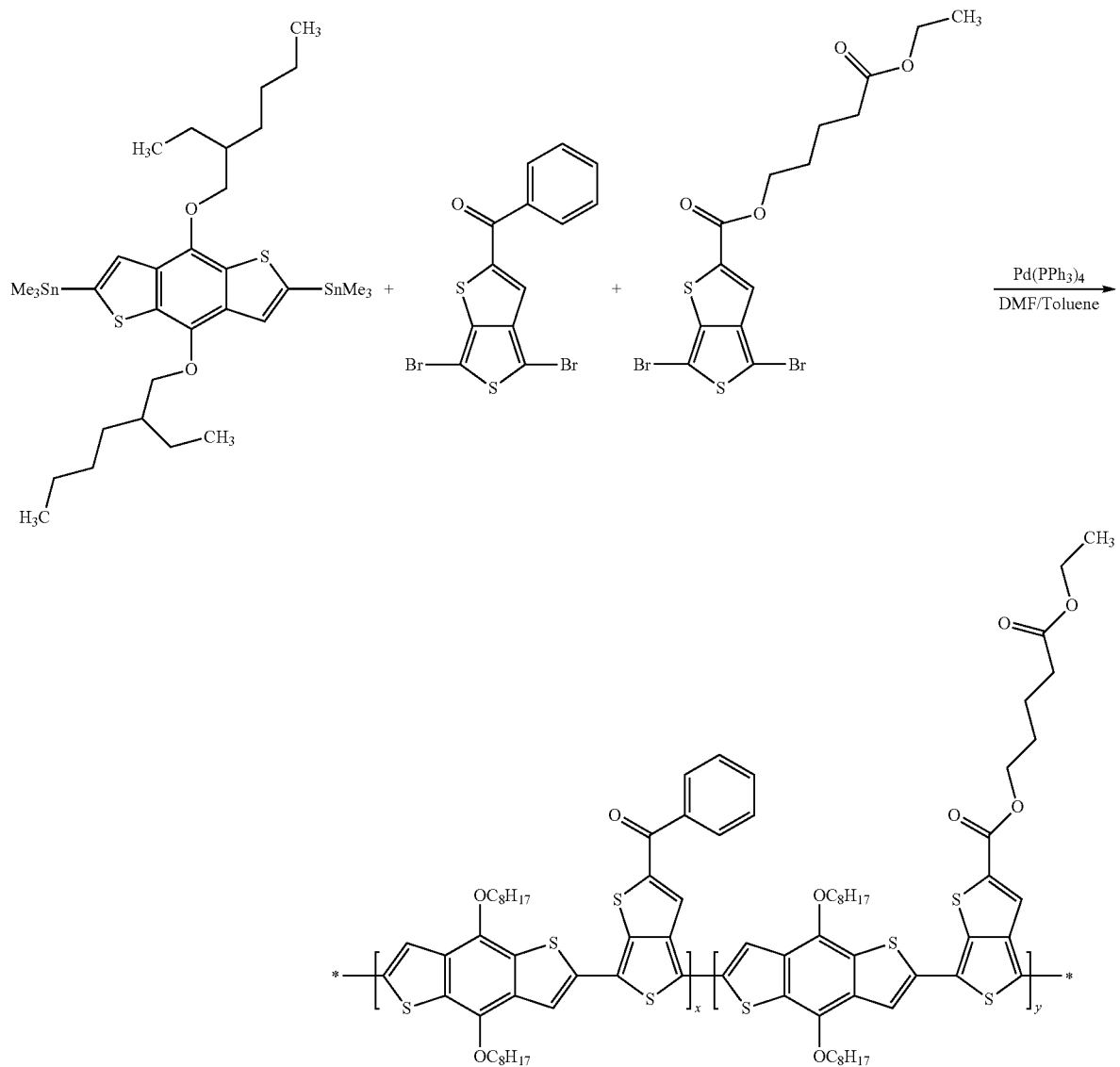

According to at least one example embodiment, about 0.400 mmol of 2,6-bis(trimethyl tin)-1,8-bis((2-ethylhexyl)oxy)benzo[1,2-b:4,5-b']dithiophene, about 0.100 mmol of 4,6-dibromothieno[3,4-b]thiophen-2-yl(phenyl)methanone, and about 0.300 mmol of 5-ethoxy-5-oxopentyl-4,6-dibromothieno[3,4-b]thiophene-2-carboxylate may be added into about 8 ml of DMF/toluene (volume ratio=1:4), added with a catalyst of about 0.017 mmol of $Pd(PPh_3)_4$ and agitated at a temperature of about 120° C. for about 6 hours to provide an electron-donating polymer. A number average molecular weight of the electron-donating polymer may be about 31,000.

Example 3

Preparation of an Electron-Donating Polymer

An electron-donating polymer may be prepared according to the same process as in Example 2, except that about 0.500 mmol of 2,6-bis(trimethyl tin)-1,8-bis((2-ethylhexyl)oxy)benzo[1,2-b:4,5-b']dithiophene, about 0.250 mmol of 4,6-dibromothieno[3,4-b]thiophen-2-yl(phenyl)methanone, about 0.250 mmol of 5-ethoxy-5-oxopentyl-4,6-dibromothieno[3,4-b]thiophene-2-carboxylate, about 10 ml of DMF/toluene (volume ratio=1:4), and about 0.020 mmol of $Pd(PPh_3)_4$ may be used. A number average molecular weight of the electron-donating polymer may be about 25,000.

Example 4

Preparation of an Electron-Donating Polymer

An electron-donating polymer may be prepared according to the same procedure as in Example 2, except that about 0.300 mmol of 4,6-dibromothieno[3,4-b]thiophen-2-yl(phenyl)methanone and about 0.100 mmol of 5-ethoxy-5-oxopentyl-4,6-dibromothieno[3,4-b]thiophene-2-carboxylate may be used. A number average molecular weight of the electron-donating polymer may be about 32,000.

Comparative Example 1

Preparation of an Electron-Donating Polymer

An electron-donating polymer may be prepared according to the following Reaction Scheme 3.

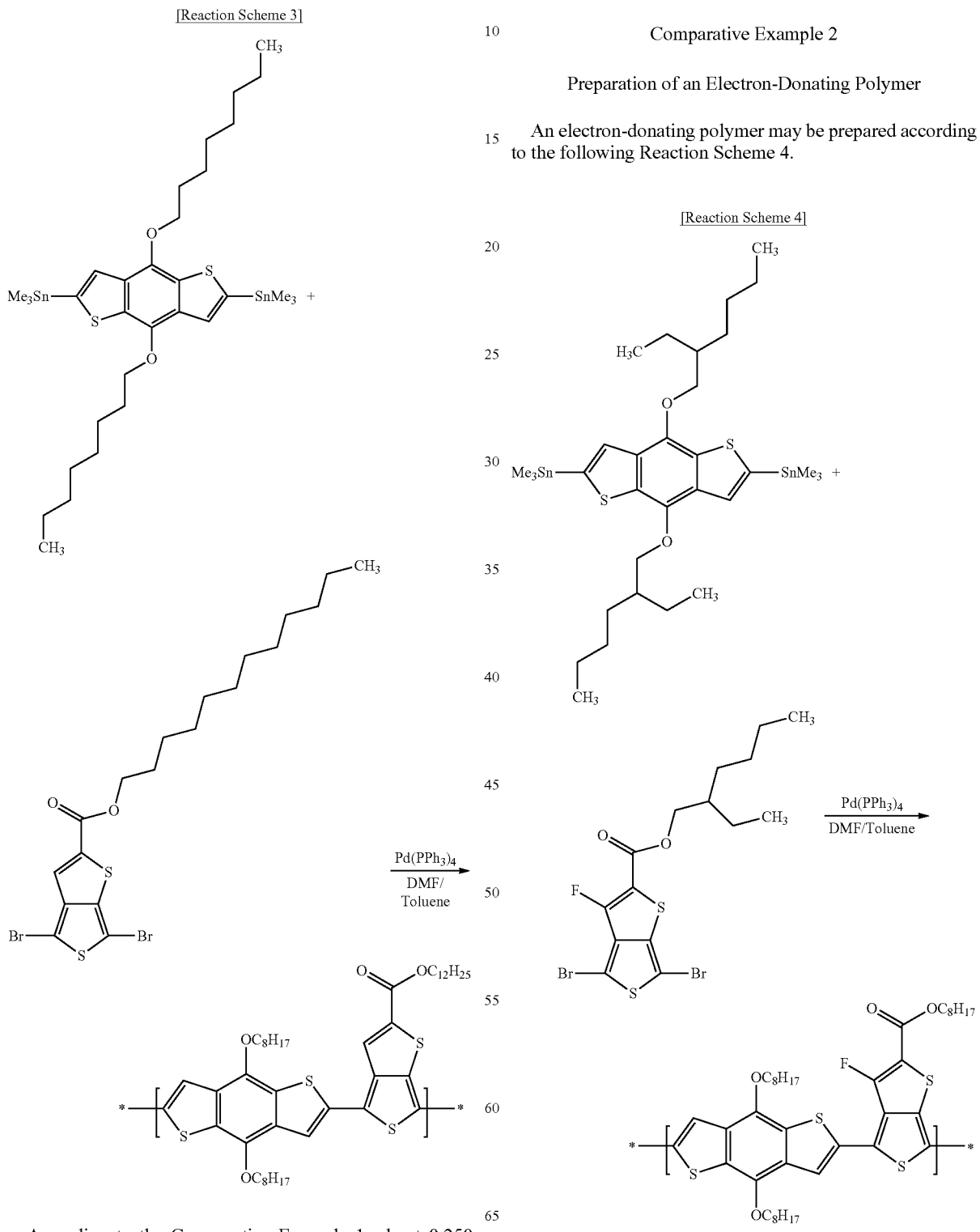

[Reaction Scheme 3]

[Reaction Scheme 4]

According to the Comparative Example 1, about 0.250 mmol of 2,6-bis(trimethyl tin)-1,8-bis(octyloxy)benzo[1,2-b:4,5-b']dithiophene and about 0.250 mmol of dodecylcarboxy-6-dibromo-thieno[3,4-b]thiophene may be added into about 5 ml of DMF/toluene (volume ratio=1:4), added with a catalyst of about 0.010 mmol of Pd(PPh$_3$)$_4$ and agitated at a temperature of about 120° C. for about 6 hours to provide an electron-donating polymer. A number average molecular weight of the electron-donating polymer may be about 40,000.

Comparative Example 2

Preparation of an Electron-Donating Polymer

An electron-donating polymer may be prepared according to the following Reaction Scheme 4.

According to Comparative Example 2, about 0.250 mmol of 2,6-bis(trimethyl tin)-1,8-bis(octyloxy)benzo[1,2-b:4,5-b']dithiophene and about 0.250 mmol of 2-ethylhexyl carboxy-6-dibromo-3-fluorothieno[3,4-b]thiophene may be added into about 5 ml of DMF/toluene (volume ratio=1:4), added with a catalyst of about 0.010 mmol of Pd(PPh$_3$)$_4$ and agitated at a temperature of about 120° C. for about 6 hours to provide an electron-donating polymer. A number average molecular weight of the electron-donating polymer may be about 20,000.

Comparative Example 3

Preparation of an Electron-Donating Polymer

A polymer including a repeating unit represented by the following Chemical Formula 14 may be used as an electron-donating polymer. A number average molecular weight of the electron-donating polymer may be about 35,000.

[Chemical Formula 14]

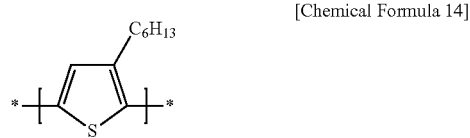

Example 5

Fabrication of Solar Cell

A transparent glass substrate with a thickness of 1 mm may be prepared. An indium tin oxide (ITO) anode with a thickness of about 150 nm may be provided on the transparent glass substrate according to, for example, a sputtering method. A PEDOT:PSS (poly(3,4-ethylenedioxythoiphene):poly(styrenesulfonate)) layer with a thickness of about 30 nm may be provided on the ITO anode according to, for example, a spin coating method and baked for about one hour. For the spin coating, conventional equipment may be used.

In the fabrication, about 8 mg of electron-donating polymer obtained from Example 1 and about 12 mg of C71-PCBM may be introduced into about 0.97 ml of chlorobenzene, added with about 0.03 mg of diiodooctane and agitated for about 14 hours to provide a mixture. The mixture may be coated on the PEDOT:PSS layer according to, for example, a spin coating method (about 2000 rpm) to a thickness of about 80 nm to provide a photoactive layer. For the spin coating, conventional equipment may be used.

A Ca/Al cathode with a thickness of about 20 nm/80 nm may be provided on the photoactive layer according to, for example, thermal evaporation. For the thermal evaporation, conventional equipment may be used.

Example 6

Fabrication of Solar Cell

A solar cell is fabricated according to the same procedure as in Example 5, except that about 8 mg of the electron-donating polymer obtained from Example 2 and about 12 mg of C71-PCBM may be added into about 0.97 ml of chlorobenzene and added with about 0.03 mg of diiodooctane and agitated for about 14 hours to provide a mixture, and then the mixture may be coated on the PEDOT:PSS layer according to a spin coating method (about 1500 rpm) to a thickness of about 30 nm to provide a photoactive layer.

Comparative Example 4

Fabrication of Solar Cell

A solar cell may be fabricated according to the same procedure as in Example 5, except that about 12 mg of the electron-donating polymer obtained from Comparative Example 1 and about 12 mg of C71-PCBM may be added into about 0.97 ml of chlorobenzene and added with about 0.03 mg of diiodooctane and agitated for about 14 hours to provide a mixture, and then the mixture may be coated on the PEDOT:PSS layer according to a spin coating method (about 2500 rpm) to a thickness of about 100 nm to provide a photoactive layer.

Comparative Example 5

Fabrication of Solar Cell

A solar cell may be fabricated according to the same procedure as in Example 5, except that about 10 mg of the electron-donating polymer obtained from Comparative Example 2 and about 15 mg of C71-PCBM may be added into about 0.97 ml of chlorobenzene and added with about 0.03 mg of diiodooctane and agitated for about 14 hours to provide a mixture, and then the mixture may be coated on the PEDOT:PSS layer according to a spin coating method (about 1500 rpm) to a thickness of about 100 nm to provide a photoactive layer.

Comparative Example 6

Fabrication of Solar Cell

A solar cell may be fabricated according to the same procedure as in Example 5, except that about 20 mg of the electron-donating polymer obtained from Comparative Example 3 and about 20 mg of C71-PCBM may be added into about 1 ml of dichlorobenzene and agitated for about 14 hours to provide a mixture, and then the mixture may be coated on the PEDOT:PSS layer according to a spin coating method (about 800 rpm) to a thickness of about 200 nm to provide a photoactive layer.

Experimental Example 1

IR Measurement

The electron-donating polymers according to Examples 1-4 and Comparative Examples 1-3 are respectively evaluated to determine their IR spectrums according to an ATR method by using a conventional spectrometer. The IR spectrum of the electron-donating polymer according to Example 1 is illustrated in FIG. 2, the IR spectrum of the electron-donating polymer according to Example 2 is illustrated in FIG. 3, the IR spectrum of the electron-donating polymer according to Comparative Example 1 is illustrated in FIG. 4, and the IR spectrum of the electron-donating polymer according to Comparative Example 2 is illustrated in FIG. 5.

Figure 2:
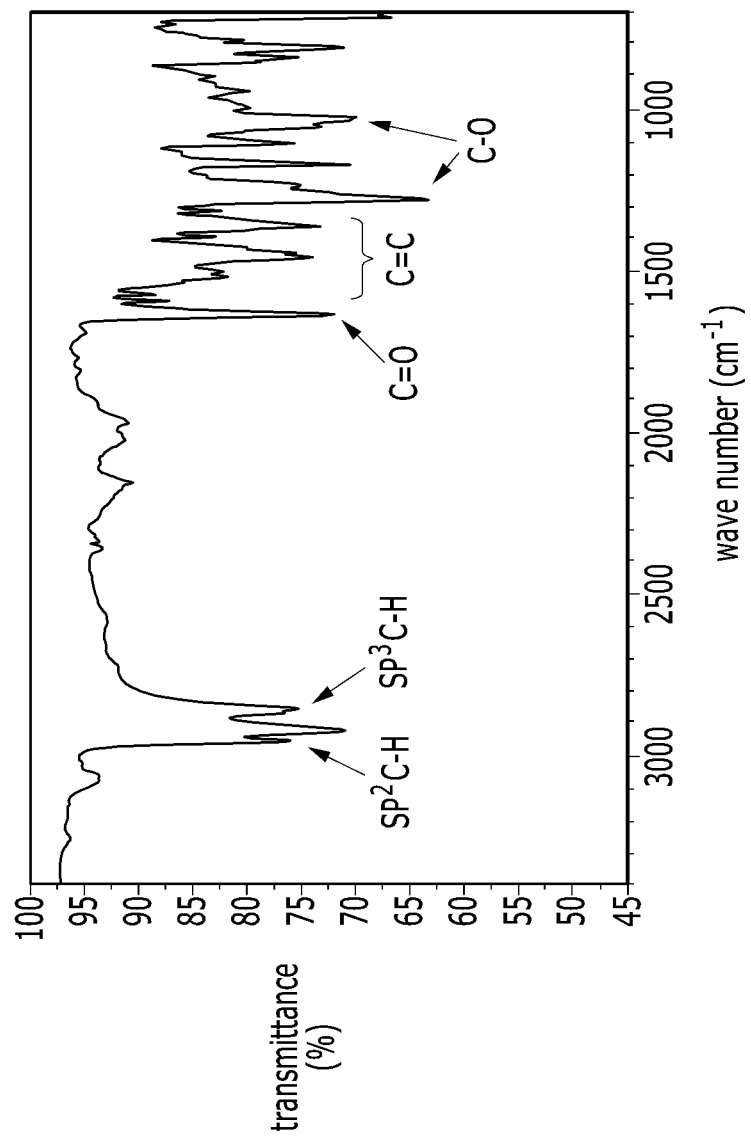

Referring to FIG. 2, because there is a 2956 cm$^{-1}$ peak showing aromatic C—H, a 2852 cm$^{-1}$ peak showing aliphatic C—H, a 1516 cm$^{-1}$ peak showing C=C stretching, a 1640 cm$^{-1}$ peak showing phenylmethanone, and 1276 cm$^{-1}$ and 1028 cm$^{-1}$ peaks showing C—O stretching, it may be confirmed that the electron-donating polymer according to Example 1 is a material according to Reaction Scheme 1.

Figure 3:
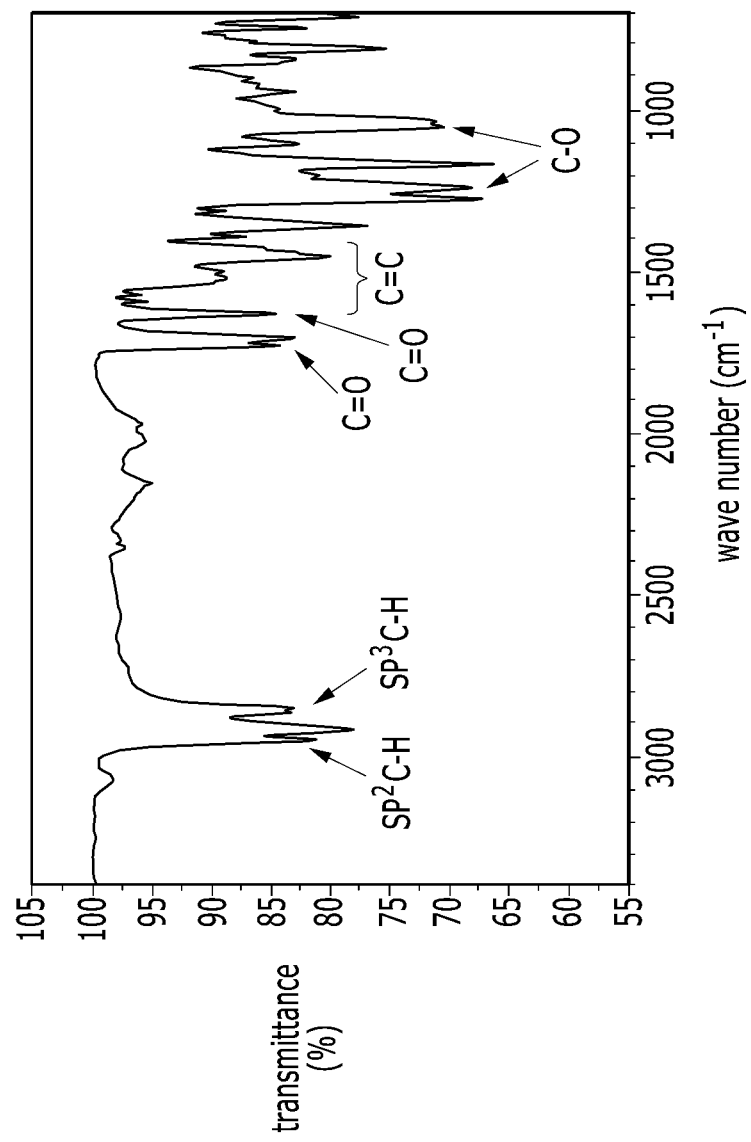

Referring to FIG. 3, because there is a 2956 cm$^{-1}$ peak showing aromatic C—H, a 2856 cm$^{-1}$ peak showing C=C stretching, a 1637 cm$^{-1}$ peak showing C=O of phenylmethanone, a 1714 cm$^{-1}$ peak showing C=O of 5-ethoxy-5-oxopentyl carboxyl group, and 1280 cm$^{-1}$ and 1045 cm$^{-1}$ peaks showing C—O stretching, it may be confirmed that the electron-donating polymer according to Example 2 is a material according to Reaction Scheme 2.

Figure 4:
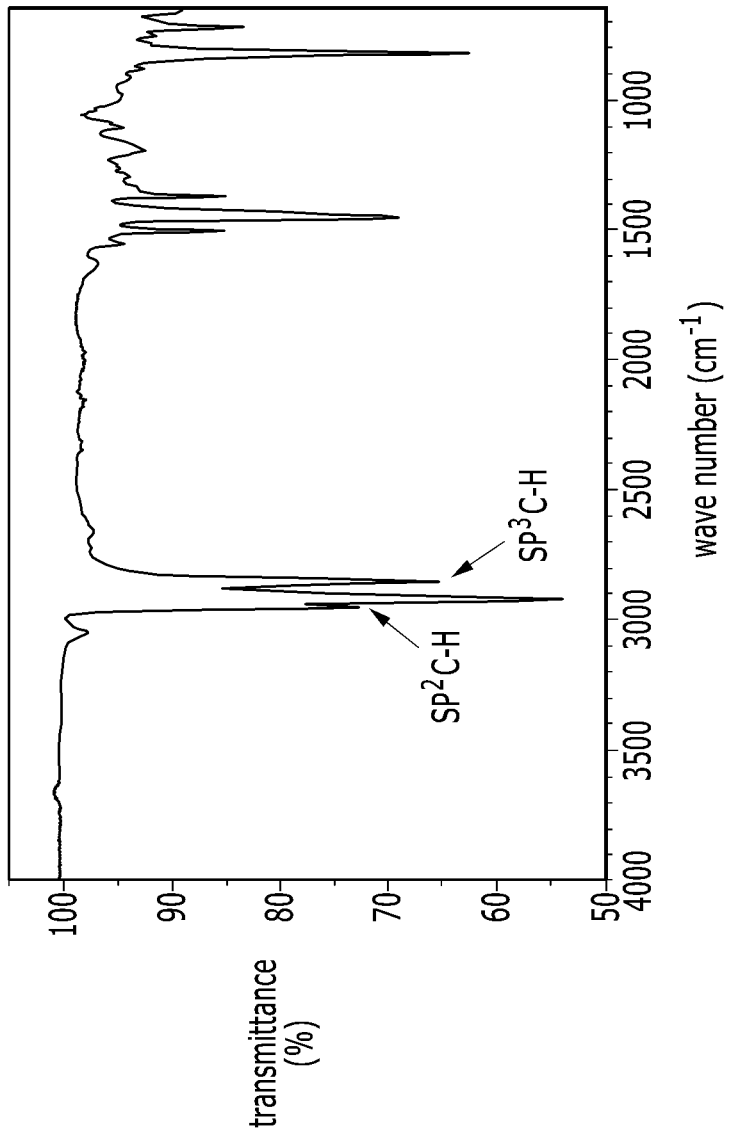
Figure 5:
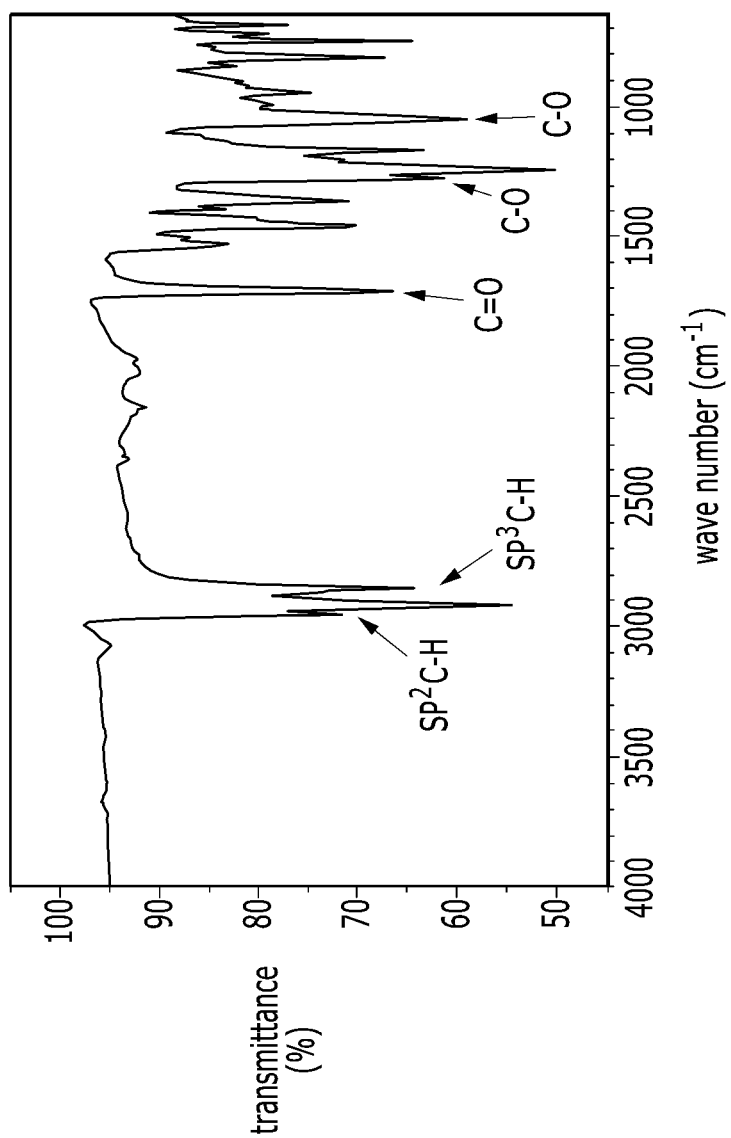

Referring to FIG. 4, because there is a 2924 cm$^{-1}$ peak showing aromatic C—H, a 2852 cm$^{-1}$ peak showing aliphatic C—H, a 1710 cm$^{-1}$ peak showing C=O of thieno[3,4-b]thiophene, and 1276 cm$^{-1}$ and 1045 cm$^{-1}$ peaks showing C—O stretching, it may be confirmed that the electron-donating polymer according to Comparative Example 1 is a material according to Reaction Scheme 3.

Referring to FIG. 5, because there is a 2922 cm$^{-1}$ peak showing aromatic C—H, a 2852 cm$^{-1}$ peak showing aliphatic C—H, a 1710 cm$^{-1}$ peak showing C=O of thieno[3,4-b]thiophene, and 1276 cm$^{-1}$ and 1045 cm$^{-1}$ peaks showing C—O stretching, it may be confirmed that the electron-donating polymer according to Comparative Example 2 is a material according to Reaction Scheme 4.

Experimental Example 2

Measurement of Bandgap

The electron-donating polymers according to Examples 1-4 and Comparative Examples 1-3 are respectively evaluated regarding HOMO level, LUMO level and bandgap according to cyclic voltammetry (CV). The results are listed in the following Table 1.

TABLE 1

|  | HOMO (eV) | LUMO (eV) | Bandgap (eV) |
| --- | --- | --- | --- |
| Example 1 | −4.96 | −3.64 | 1.59 |
| Example 2 | −5.275 | −3.78 | 1.6 |
| Example 3 | −5.32 | −3.75 | 1.57 |
| Example 4 | −5.3 | −3.75 | 1.55 |
| Comparative Example 1 | −5.3 | −3.66 | 1.64 |
| Comparative Example 2 | −4.83 | −3.2 | 1.63 |
| Comparative Example 3 | −4.97 | −3.07 | 1.9 |

Referring to Table 1, bandgaps of electron-donating polymers according to Examples 1-4 are less than bandgaps of the electron-donating polymers according to Comparative Examples 1-3, and it may be confirmed that the bandgap may be controlled by adjusting the mole ratio of the included repeating unit. This is because the electron-donating polymers according to Examples 1-4 may include the planar structured aromatic organic group exhibiting the electron withdrawing effect.

Experimental Example 3

Evaluation of Solar Cell Efficiency

Figure 6:
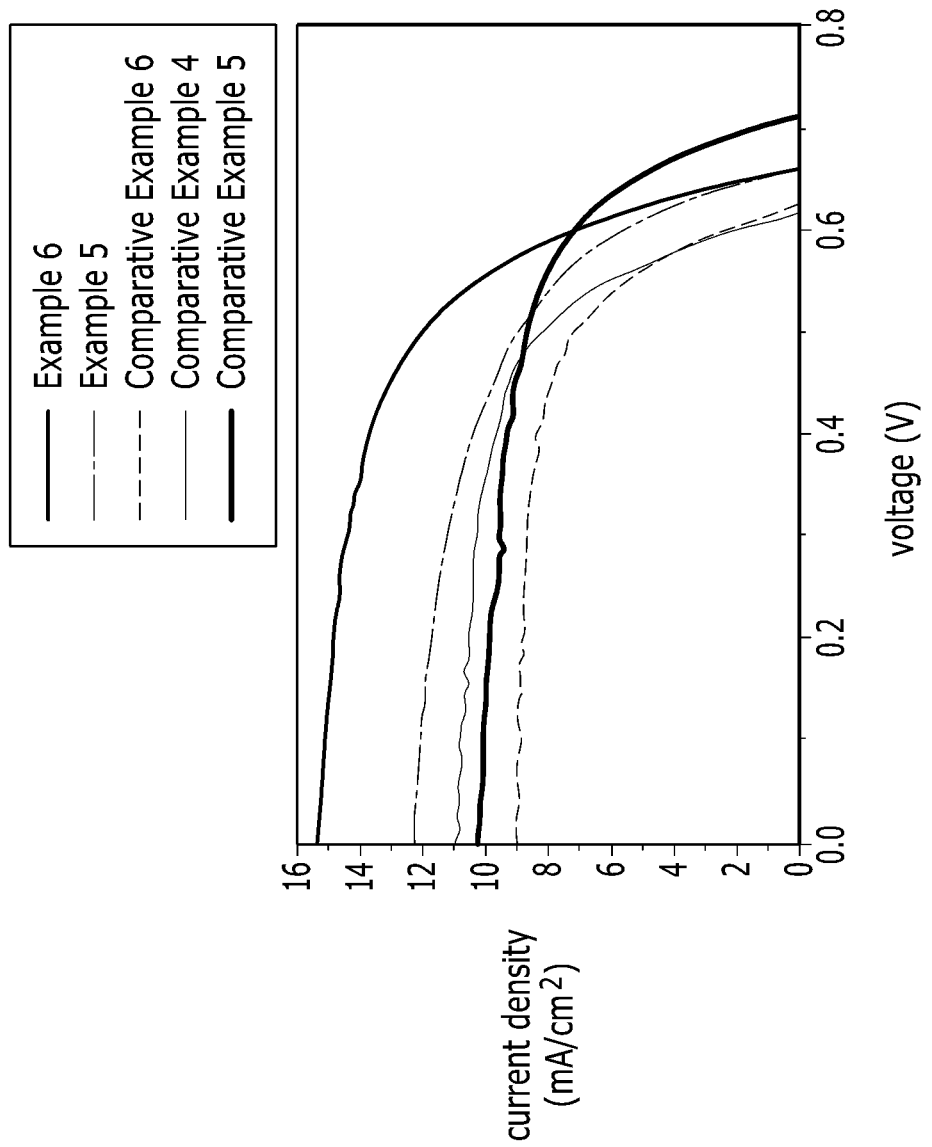

Solar cells obtained according to Example 5, Example 6, and Comparative Examples 4-8 are respectively evaluated regarding an I-V curve using conventional equipment. FIG. 6 illustrates I-V curves of solar cells according to Example 5, Example 6, and Comparative Examples 4-6.

Short circuit current density ($J_{sc}$), open circuit voltage ($V_{oc}$), fill factor (FF) and photoelectric conversion efficiency obtained from the I-V curve are listed in the following Table 2.

TABLE 2

|  | Short circuit current density (mA/cm$^2$) | Open circuit voltage (mV) | Fill factor (%) | Photoelectric conversion efficiency (%) |
| --- | --- | --- | --- | --- |
| Example 5 | 12.3 | 665.5 | 55.6 | 4.47 |
| Example 6 | 15.3 | 655.5 | 59.7 | 6.00 |
| Comparative Example 4 | 10.9 | 618.2 | 62.2 | 4.19 |
| Comparative Example 5 | 10.2 | 709.1 | 61.6 | 4.46 |
| Comparative Example 6 | 9.0 | 628.3 | 63.7 | 3.60 |

Referring to Table 2, it may be confirmed that solar cells according to Examples 5 and 6 have higher and/or improved short circuit current density and much better and/or improved photoelectric conversion efficiency than the solar cells according to Comparative Examples 4-6.

While example embodiments have been particularly shown and described, it will be understood by one of ordinary skill in the art that variations in form and detail may be made therein without departing from the spirit and scope of the claims.

What is claimed is:

1. An electron-donating polymer, comprising:
   a repeating unit A including a repeating unit according to Chemical Formula 1 and at least one repeating unit according to one of Chemical Formulae 2-4,

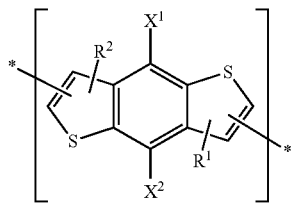

[Chemical Formula 1]

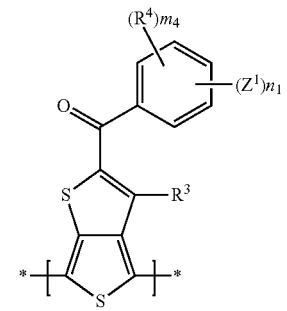

[Chemical Formula 2]

[Chemical Formula 3]

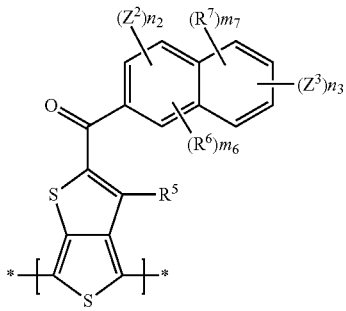

[Chemical Formula 4]

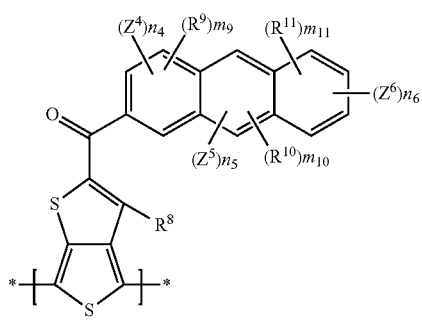

wherein, in Chemical Formula 1, $X^1$ and $X^2$ are one of same and different, and each of $X^1$ and $X^2$ are independently one of hydrogen, a halogen, a substituted C1-C20 aliphatic organic group, an unsubstituted C1-C20 aliphatic organic group, a hydroxy group, a substituted C1-C20 alkoxy group, an unsubstituted C1-C20 alkoxy group, a substituted C1-C20 ester group, an unsubstituted C1-C20 ester group, a thiol group, and $SR^{100}$, where $R^{100}$ is one of a substituted C1-C20 aliphatic organic group, an unsubstituted C1-C20 aliphatic organic group, a substituted C2-C30 aromatic organic group, an unsubstituted C2-C30 aromatic organic group, a substituted C2-C30 heterocycloalkyl group, an unsubstituted C2-C30 heterocycloalkyl group, and $R^1$ and $R^2$ are one of same and different, and $R^1$ and $R^2$ are each independently one of hydrogen, a substituted C1-C20 linear alkyl group, a substituted $C_1$-C20 branched alkyl group, an unsubstituted C1-20 linear alkyl group, and an unsubstituted C1-C20 branched alkyl group, a substituted C3-C20 cycloakyl group, an unsubstituted C3-C20 cycloalkyl group, a substituted C1-C20 alkoxy group, an unsubstituted C1-C20 alkoxy group, a substituted C6-C30 aryl group, and an unsubstituted C6-C30 aryl group, a substituted C2-C30 heteroaryl group, and an and unsubstituted C2-C30 heteroaryl group, and at least one $CH_2$ group included in $R^1$ and $R^2$ is substituted with one of —O—, —S—, —$SO_2$—, —CO—, —OCO—, —COO—, —CH=CH—, —C≡C—, and —$SiR^{101}R^{102}$, where $R^{101}$ and $R^{102}$ are one of same and different, and $R^{101}$ and $R^{102}$ are each independently one of hydrogen, a substituted C1-C20 linear alkyl group, a; substituted C1-C20 branched alkyl group, an unsubstituted C1-C20 linear alkyl group and an unsubstituted C1-C20 branched alkyl group, a substituted C3-C20 cycloalkyl group, an unsubstituted C3-C20 cycloalkyl group, a substituted C1-C20 alkoxy group, an unsubstituted C1-C20 alkoxy group, a substituted C6-C30 aryl group, an unsubstituted C6-C30 aryl group, a substituted C2-C30 heteroaryl group, and an unsubstituted C2-C30 heteroaryl group; and wherein, in Chemical Formulae 2-4, $Z^1$-$Z^6$ are one of same and different, and are each independently one of hydrogen and an electron withdrawing group, $n_1$ is an integer ranging from 1 to 5, inclusive,
$n_2$ is an integer ranging from 0 to 3, inclusive,
$n_3$ is an integer ranging from 0 to 4, inclusive,
$n_2+n_3$ is an integer ranging from 1 to 5, inclusive,
$n_4$ is an integer ranging from 0 to 3, inclusive,
$n_5$ is an integer ranging from 0 to 2, inclusive,
$n_6$ is an integer ranging from 0 to 4, inclusive,
$n_4+n_5+n_6$ is an integer ranging from 1 to 5, inclusive,
$R^4$, $R^6$, $R^7$, and $R^9$-$R^{11}$ are one of same and different, and $R^4$, $R^6$, $R^7$, and $R^9$-$R^{11}$ are each independently one of hydrogen, a substituted C1-C20 linear alkyl group, a substituted C1-C20 branched alkyl group, an unsubstituted C1-C20 linear alkyl group, an unsubstituted C1-C20 branched alkyl group, a substituted C3-C20 cycloalkyl group, an unsubstituted C3-C20 cycloalkyl group, substituted C1-C20 alkoxy group, an unsubstituted C1-C20 alkoxy group, a substituted C6-C30 aryl group, an unsubstituted C6-C30 aryl group, a substituted C2-C30 heteroaryl group, and an unsubstituted C2-C30 heteroaryl group, and at least one $CH_2$ group included in the $R^4$, $R^6$, $R^7$, and $R^9$-$R^{11}$ is substituted with one of —O—, —S—, —$SO_2$—, —CO—, —OCO—, —COO—, —CH=CH—, —C≡C—, and —$SiR^{103}R^{104}$, where $R^{103}$ and $R^{104}$ are one of same and different, and $R^{103}$ and $R^{104}$ are each independently one of hydrogen, a substituted C1-C20 linear alkyl group, a substituted C1-C20 branched alkyl group, an unsubstituted C1-C20 linear alkyl group, an unsubstituted C1-C20 branched alkyl group, a substituted C3-C20 cycloalkyl group, an unsubstituted C3-C20 cycloalkyl group, a substituted C1-C20 alkoxy group, an unsubstituted C1-C20 alkoxy group, a substituted C6-C30 aryl group, an unsubstituted C6-C30 aryl group, a substituted C2-C30 heteroaryl group, and an unsubstituted C2-C30 heteroaryl group, $R^3$, $R^5$, and $R^8$ are one of same and different, and are each independently one of hydrogen, a halogen, a substituted C1-C20 aliphatic organic group, an unsubstituted C1-C20 aliphatic organic group, a hydroxy group, a substituted C1-C20 alkoxy group, an unsubstituted C1-C20 alkoxy group, a substituted C1-C20 ester group, an unsubstituted C1-C20 ester group, a thiol group, and —$SR^{105}$, where $R^{105}$ is one of a substituted C1-C20 aliphatic organic group, an unsubstituted C1-C20 aliphatic organic group, a substituted C2-C20 aromatic organic group, an unsubstituted C2-C30 aromatic organic group, a substituted C2-C30 heterocycloalkyl group, and an unsubstituted C2-C30 heterocycloalkyl group, $m_4$ is one of same and different in each of the repeating unit according to Chemical Formula 2, and each $m_4$ is independently an integer ranging from 0 to 5, inclusive, $m_6$ and $m_9$ are each independently an integer ranging from 0 to 3, inclusive, $m_7$ and $m_{11}$ are each independently an integer ranging from 0 to 4, inclusive, and $m_{10}$ is one of same and different in each of the repeating unit according to Chemical Formula 4, and each $m_{10}$ is independently an integer ranging from 0 to 2, inclusive.

2. The electron-donating polymer of claim 1, wherein the electron withdrawing group is one of —$CF_3$, —$CCl_3$, —$CBr_3$, —$Cl_3$, —F, —Cl, —Br, —I, —$NO_2$, —NO, —CN, —$COCH_3$, —$CO_2C_2H_5$, —$SO_3$, —$SO_3R^{106}$, a residual group derived from metal sulfonate including one of a Group 1 metal and Group 2 metal, and a C2-C30 aromatic organic group, and $R^{106}$ is one of same and different in each of the at least one repeating unit according to one of Chemical Formulae 2-4, and is independently one of hydrogen, a substituted C1-C20 aliphatic organic group, and an unsubstituted C1-C20 aliphatic organic group.

3. The electron-donating polymer of claim 1 wherein, in Chemical Formula 1, $X^1$ and $X^2$ are one of same and different, and are each independently one of
a substituted C1-C20 alkyl group, an unsubstituted C1-C20 alkyl group, a substituted C1-C20 alkoxy group, an unsubstituted C1-C20 alkoxy group, one of a substituted C1-C20 ester group, an unsubstituted C1-C20 ester group, and —$SR^{100}$, where $R^{100}$ is one of
a substituted C1-C20 alkyl group, an unsubstituted C1-C20 alkyl group, a substituted C2-C30 heterocylcoalkyl group, and an unsubstituted C2-C30 heterocycloalkyl group, and $R^1$ and $R^2$ are one of same and different, and are each independently one of hydrogen, a substituted C1-C20 alkyl group and an unsubstituted C1-C20 alkyl group, and in Chemical Formulae 2-4, $Z^1$-$Z^6$ are one of same and different, and are each independently one of hydrogen, —$SO_3R^{106}$, a halogen, —$NO_2$, —NO, and —CN, where $R^{106}$ is one of same and different in each of the at least one repeating unit according to one of Chemical Formulae 2-4, and is independently one of hydrogen, a substituted C1-C20 aliphatic organic group, and unsubstituted C1-C20 aliphatic organic group, $n_1$ is an integer ranging from 1 to 5, inclusive,
$n_2$ is an integer ranging from 0 to 3, inclusive,
$n_3$ is an integer ranging from 0 to 4, inclusive,
$n_2+n_3$ is an integer ranging from 1 to 5, inclusive,
$n_4$ is an integer ranging from 0 to 3, inclusive,
$n_5$ is an integer ranging from 0 to 2, inclusive,
$n_6$ is an integer ranging from 0 to 2, inclusive,
$n_4n_5+n_6$ is an integer ranging from 1 to 5, inclusive,
$R^4$, $R^6$, $R^7$, and $R^9$-$R^{11}$ are one of same and different, and are one of hydrogen, a substituted C1-C20 alkyl group, and an unsubstituted C1-C20 alkyl group, $R^3$, $R^5$, and $R^8$ are one of same and different, and are each independently one of hydrogen and a halogen, $m_4$ is one of same and different in each of the repeating unit according to Chemical Formula 2, and each $m_4$ is independently an integer ranging from 0 to 5, inclusive, $m_6$ and $m_9$ are each independently an integer ranging from 0 to 3, inclusive, $m_7$ and $m_{11}$ are each independently an integer ranging from 0 to 4, inclusive, and $m_{10}$ is one of same and different in each of the repeating unit according to Chemical Formula 4, and each $m_{10}$ is independently an integer ranging from 0 to 2, inclusive.

4. The electron-donating polymer of claim 1 wherein the repeating unit A includes repeating units represented by one of the following Chemical Formulae 7-1 to 7-3, and a combination thereof,

[Chemical Formula 7-1]

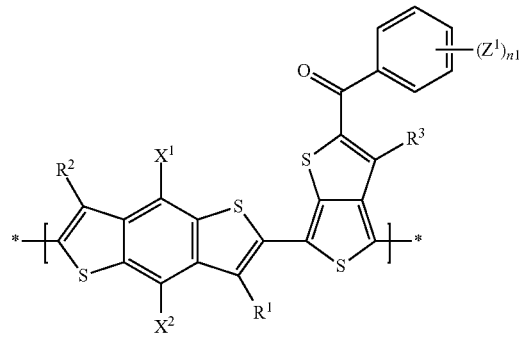

[Chemical Formula 7-2]

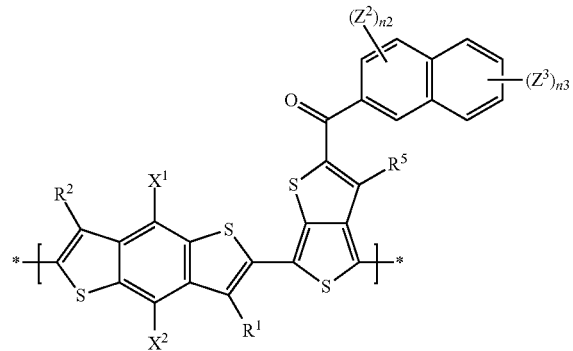

[Chemical Formula 7-3]

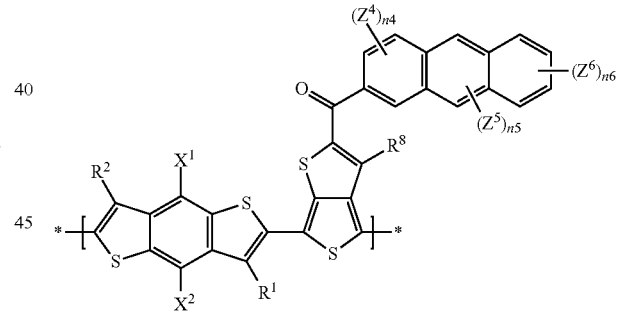

and, in Chemical Formulae 7-1 to 7-3, $X^1$ and $X^2$ are one of same and different, and are each independently one of
a substituted C1-C20 alkyl group, an unsubstituted C1-C20 alkyl group, a substituted C1-C20 alkoxy group, an unsubstituted C1-C20 alkoxy group, a substituted C1-C20 ester group, an unsubstituted C1-C20 ester group, and —$SR^{100}$, where $R^{100}$ is one of
a substituted C1-C20 alkyl group, an unsubstituted C1-C20 alkyl group, a substituted C2-C30 heterocycloalkyl group, and an unsubstituted C2-C30 heterocycloalkyl group, $R^1$ and $R^2$ are one of same and different, and are each independently one of hydrogen, a substituted C1-C20 alkyl group, and an unsubstituted C1-C20 alkyl group, $R^3$, $R^5$, and $R^8$ are one of same and different, and are each independently one of hydrogen and a halogen, $Z^1$-$Z^6$ are one of same and different, and are each independently one of hydrogen, —$SO_3R^{106}$, a halogen, —$NO_2$, —NO, and —CN, where $R^{106}$ is one of same and different in each of the at least one of the repeating unit according to one of Chemical Formulae 2-4, and is independently one of hydrogen, a substituted C1-C20 aliphatic organic group, and an unsubstituted C1-C20 aliphatic organic group, $n_1$ is an integer that is one of 1 and 2,
$n_2$ is an integer ranging from 0 to 2, inclusive,
$n_3$ is an integer ranging from 0 to 2, inclusive,
$n_2+n_3$ is an integer that is one of 1 and 2,
$n_4$ is an integer ranging from 0 to 2, inclusive,
$n_5$ is an integer ranging from 0 to 2, inclusive,
$n_6$ is an integer ranging from 0 to 2, inclusive, and
$n_4+n_5+n_6$ is an integer that is one of 1 and 2.

5. The electron-donating polymer of claim 4, wherein $X^1$ and $X^2$ are one of same and different, and are each independently one of a substituted C1-C20 alkoxy group, and an unsubstituted C1-C20 alkoxy group, $R^1$-$R^3$, $R^5$, and $R^8$ are hydrogen, and $Z^1$-$Z^6$ are one of same and different, and are each independently one of hydrogen, —$SO_3R^{106}$, a halogen, —$NO_2$, —NO, and —CN, where $R^{106}$ is one of same and different in each of the at least one repeating unit according to one of Chemical Formulae 2-4, and is independently one of hydrogen, a substituted C1-C20 aliphatic organic group, and an unsubstituted C1-C20 aliphatic organic group.

6. The electron-donating polymer of claim 1, wherein the electron-donating polymer includes the repeating unit according to Chemical Formula 1 and the at least one repeating unit according to one of Chemical Formulae 2-4 at a mole ratio of about 1:1 to about 1:1.4.

7. The electron-donating polymer of claim 1, wherein a number average molecular weight of the electron-donating polymer is about 1000 to about 800,000.

8. The electron-donating polymer of claim 1, wherein a bandgap of the electron-donating polymer is about 1.2 eV to about 2.5 eV.

9. An electron-donating polymer, comprising:
a repeating unit A including a repeating unit according to Chemical Formula 1 and at least one repeating unit according to one of Chemical Formulae 2-4; and
a repeating unit B including a repeating unit according to Chemical Formula 1 and a repeating unit according to Chemical Formula 9,

[Chemical Formula 1]

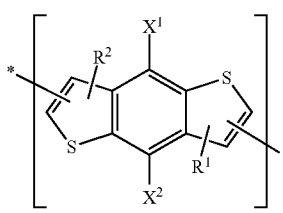

wherein, in Chemical Formula 1, $X^1$ and $X^2$ are one of same and different, and are each independently one of hydrogen, a halogen, a substituted C1-C20 aliphatic organic group, an unsubstituted C1-C20 aliphatic organic group, a hydroxy group, a substituted C1-C20 alkoxy group, an unsubstituted C1-C20 alkoxy group, a substituted C1-C20 ester group, an unsubstituted C1-C20 ester group, a thiol group, and $SR^{100}$, where $R^{100}$ is one of a substituted C1-C20 aliphatic organic group, an unsubstituted C1-C20 aliphatic organic group, a substituted C2-C30 aromatic organic group, an unsubstituted C2-C30 aromatic organic group, a substituted C2-C30 heterocycloalkyl group, and an unsubstituted C2-C30 heterocycloalkyl group, $R^1$ and $R^2$ are one of same and different, and $R^1$ and $R^2$ are each independently one of
hydrogen, a substituted C1-C20 linear alkyl group, a substituted C1-C20 branched alkyl group, an unsubstituted C1-C20 linear alkyl group, an unsubstituted C1-C20 branched alkyl group, a substituted C3-C20 cycloalkyl group, an unsubstituted C3-C20 cycloalkyl group, a substituted C1-C20 alkoxy group, an unsubstituted C1-C20 alkoxy group, a substituted C6-C30 aryl group, an unsubstituted C6-C30 aryl group, a substituted C2-C30 heteroaryl group, and an unsubstituted C2-C30 heteroaryl group, and at least one $CH_2$ group included in the $R^1$ and $R^2$ is substituted with one of —O—, —S—, —$SO_2$—, —CO—, —OCO—, —COO—, —CH=CH—, —C≡C—, and —$SiR^{101}R^{102}$, where $R^{101}$ and $R^{102}$ are one of same and different, and $R^{101}$ and $R^{102}$ are each independently one of
hydrogen, a substituted C1-C20 linear alkyl group, a substituted C1-C20 branched alkyl group, an unsubstituted C1-C20 linear alkyl group, an unsubstituted C1-C20 branched alkyl group, a substituted C3-C20 cycloalkyl group, an unsubstituted C3-C20 cycloalkyl group, a substituted C1-C20 alkoxy group, an unsubstituted C1-C20 alkoxy group, a substituted C6-C30 aryl group, an unsubstituted C6-C30 aryl group, a substituted C2-C30 heteroaryl group, and an unsubstituted C2-C30 heteroaryl group,

[Chemical Formula 2]

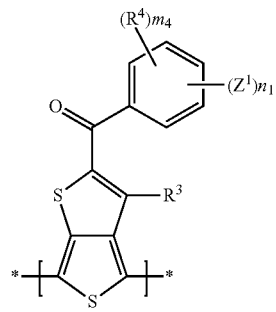

[Chemical Formula 3]

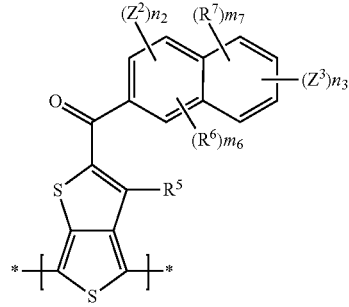

[Chemical Formula 4]

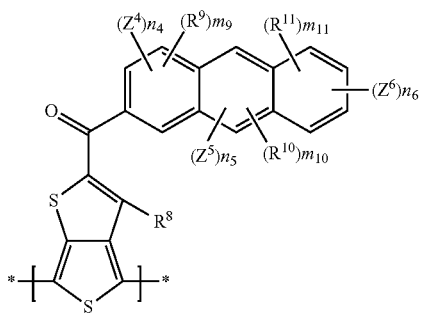

in Chemical Formulae 2-4, $Z^1$-$Z^6$ are one of same and different, and are each independently one of hydrogen and an electron withdrawing group, $n_1$ is an integer ranging from 1 to 5, inclusive,
$n_2$ is an integer ranging from 0 to 3, inclusive,
$n_3$ is an integer ranging from 0 to 4, inclusive,
$n_2+n_3$ is an integer ranging from 1 to 5, inclusive,
$n_4$ is an integer ranging from 0 to 3, inclusive,
$n_5$ is an integer ranging from 0 to 2, inclusive,
$n_6$ is an integer ranging from 0 to 4, inclusive,
$n_4+n_5+n_6$ is an integer ranging from 1 to 5, inclusive,
$R^4$, $R^6$, $R^7$, and $R^9$-$R^{11}$ are one of same and different,
$R^4$, $R^6$, $R^7$, and $R^9$-$R^{11}$ are each independently one of
hydrogen, a substituted C1-C20 linear alkyl group, a substituted C1-C20 branched alkyl group, an unsubstituted C1-C20 linear alkyl group, an unsubstituted C1-C20 branched alkyl group, a substituted C3-C20 cycloalkyl group, an unsubstituted C3-C20 cycloalkyl group, a substituted C1-C20 alkoxy group, an unsubstituted C1-C20 alkoxy group, a substituted C6-C30 aryl group, an unsubstituted C6-C30 aryl group, a substituted C2-C30 heteroaryl group, an unsubstituted C2-C30 heteroaryl group, and at least one $CH_2$ group included in the $R^4$, $R^6$, $R^7$, and $R^9$-$R^{11}$ is substituted with one of —O—, —S—, —$SO_2$—, —CO—, —OCO—, —COO—, —CH=CH—, —C≡C—, and —$SiR^{103}R^{104}$, where $R^{103}$ and $R^{104}$ are one of same and different, and $R^{103}$ and $R^{104}$ are each independently one of
hydrogen, a substituted C1-C20 linear alkyl group, a substituted C1-C20 branched alkyl group, an unsubstituted C1-C20 linear alkyl group, an unsubstituted C1-C20 branched alkyl group, a substituted C3-C20 cycloalkyl group, an unsubstituted C3-C20 cycloalkyl group, a substituted C1-C20 alkoxy group, an unsubstituted C1-C20 alkoxy group, a substituted C6-C30 aryl group, an unsubstituted C6-C30 aryl group, a substituted C2-C30 heteroaryl group, an unsubstituted C2-C30 heteroaryl group, $R^3$, $R^5$, and $R^8$ are one of same and different, and are each independently one of
hydrogen, a halogen, a substituted C1-C20 aliphatic organic group, an unsubstituted C1-C20 aliphatic organic group, a hydroxy group, a substituted C1-C20 alkoxy group, an unsubstituted C1-C20 alkoxy group, a substituted C1-C20 ester group, an unsubstituted C1-C20 ester group, a thiol group, and —$SR^{105}$, where $R^{105}$ is one of a substituted C1-C20 aliphatic organic group, an unsubstituted C1-C20 aliphatic organic group, a substituted C2-C30 aromatic organic group, an unsubstituted C2-C30 aromatic organic group, a substituted C2-C30 heterocycloalkyl group, and an unsubstituted C2-C30 heterocycloalkyl group, $m_4$ is one of same and different in each of the repeating unit according to Chemical Formula 2, and each $m_4$ is independently an integer ranging from 0 to 5, inclusive, $m_6$ and $m_9$ are each independently an integer ranging from 0 to 3, inclusive, $m_7$ and $m_{11}$ are each independently an integer ranging from 0 to 4, inclusive, and $m_{10}$ is one of same and different in each of the repeating unit according to Chemical Formula 4, and each $m_{10}$ is independently an integer ranging from 0 to 2, inclusive, and

[Chemical Formula 9]

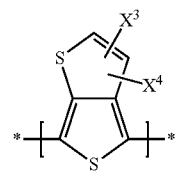

in Chemical Formula 9, $X^3$ is one of same and different in each of the repeating unit according to Chemical Formula 9, and each $X^3$ is an electron-accepting group including two ester residual groups and a divalent aliphatic organic group linking the two ester residual groups, the divalent aliphatic organic group being one of substituted and unsubstituted, and $X^4$ is one of same and different in each of the repeating unit according to Chemical Formula 9, and each $X^4$ is independently one of
hydrogen, a halogen, a substituted C1-C20 aliphatic organic group, an unsubstituted C1-C20 aliphatic organic group, a hydroxy group, a substituted C1-C20 alkoxy group, an unsubstituted C1-C20 alkoxy group, a substituted C1-C20 ester group, an unsubstituted C1-C20 ester group, a thiol group, and —$SR^{107}$, where $R^{107}$ is one of
a substituted C1-C20 aliphatic organic group, an unsubstituted C1-C20 aliphatic organic group, a substituted C2-C30 aromatic organic group, an unsubstituted C2-C30 aromatic organic group, a substituted C2-C30 heterocycloalkyl group, and an unsubstituted C2-C30 heterocycloalkyl group.

10. The electron-donating polymer of claim 9, wherein the electron withdrawing group is one of —$CF_3$, —$CCl_3$, —$CBr_3$, —$CI_3$, —F, —Cl, —Br, —I, —$NO_2$, —NO, —CN, —$COCH_3$, —$CO_2C_2H_5$, —$SO_3$, —$SO_3R^{106}$, a residual group derived from a metal sulfonate including one of a Group 1 metal and Group 2 metal, and a C2-C30 aromatic organic group, where $R^{106}$ is one of same and different in each of the at least one repeating unit according to one of Chemical Formulae 2-4, and is independently one of hydrogen, a substituted C1-C20 aliphatic group, and an unsubstituted C1-C20 aliphatic organic group.

11. The electron-donating polymer of claim 9, wherein at least one $X^3$ includes a functional group represented by one of the following Chemical Formula 10-1 and 10-2,

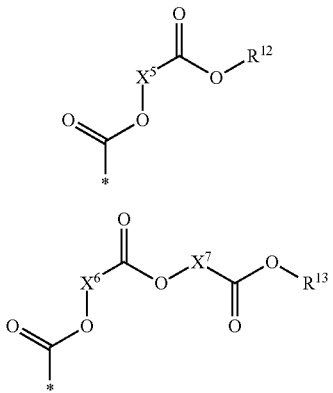

[Chemical Formula 10-1]

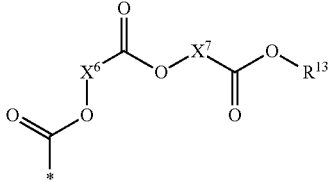

[Chemical Formula 10-2]

and, in Chemical Formulae 10-1 and 10-2, $X^5$-$X^7$ are one of same and different, and are each independently one of a substituted divalent C1-C20 aliphatic organic group, and an unsubstituted divalent C1-C20 aliphatic organic group, and $R^{12}$ and $R^{13}$ are one of same and different, and are each independently one of hydrogen, a substituted C1-C20 aliphatic organic group and an unsubstituted C1-C20 aliphatic organic group.

12. The electron-donating polymer of claim 9, wherein, in Chemical Formula 1, $X^1$ and $X^2$ are one of same and different, and are each independently one of a substituted C1-C20 alkyl group, an unsubstituted C1-C20 alkyl group, a substituted C1-C20 alkoxy group, an unsubstituted C1-C20 alkoxy group, a substituted C1-C20 ester group, an unsubstituted C1-C20 ester group, and —$SR^{100}$, where $R^{100}$ is one of a substituted C1-C20 alkyl group, an unsubstituted C1-C20 alkyl group, a substituted C2-C30 heterocycloalkyl group, and an unsubstituted C2-C30 heterocycloalkyl group, and $R^1$ and $R^2$ are one of same and different, and are each independently one of hydrogen, a substituted C1-C20 alkyl group, and an unsubstituted C1-C20 alkyl group, and, in Chemical Formulae 2-4, $Z^1$-$Z^6$ are one of same and different, and are each independently one of hydrogen, —$SO_3R^{106}$, and a halogen, where $R^{106}$ is one of same and different in each of the at least one repeating unit according to one of Chemical Formulae 2-4, and $R^{106}$ is independently one of hydrogen, a substituted C1-C20 aliphatic organic group and an unsubstituted C1-C20 aliphatic organic group, $n_1$ is an integer ranging from 1 to 5, inclusive,
$n_2$ is an integer ranging from 0 to 3, inclusive,
$n_3$ is an integer ranging from 0 to 4, inclusive,
$n_2+n_3$ is an integer ranging from 1 to 5, inclusive,
$n_4$ is an integer ranging from 0 to 3, inclusive,
$n_5$ is an integer ranging from 0 to 2, inclusive,
$n_6$ is an integer ranging from 0 to 4, inclusive,
$n_4+n_5+n_6$ is an integer ranging from 1 to 5, inclusive,
$R^4$, $R^6$, $R^7$, and $R^9$-$R^{11}$ are one of same and different, and are each independently one of hydrogen, a substituted C1-C20 alkyl group, and an unsubstituted C1-C20 alkyl group,
$R^3$, $R^5$, and $R^8$ are one of same and different, and are each independently one of hydrogen and a halogen,
$m_4$ is one of same and different in each of the repeating unit according to Chemical Formula 2, and each $m_4$ is independently an integer ranging from 0 to 5, inclusive, $m_6$ and $m_9$ are each independently an integer ranging from 0 to 3, inclusive,
$m_7$ and $m_{11}$ are each independently an integer ranging from 0 to 4, inclusive, and
$m_{10}$ is one of same and different in each of the repeating unit according to Chemical Formula 4, and each $m_{10}$ is independently an integer ranging from 0 to 2, inclusive, the repeating unit represented by Chemical Formula 9 includes one of a repeating unit according by Chemical Formula 9-1, a repeating unit according to Chemical Formula 9-2, and a combination thereof,

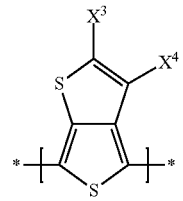

[Chemical Formula 9-1]

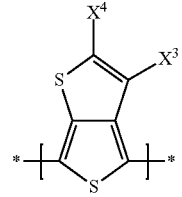

[Chemical Formula 9-2]

in Chemical Formulae 9-1 and 9-2, $X^3$ is one of same and different in each of the repeating unit according to Chemical Formula 9-1 and the repeating unit according to Chemical Formula 9-2, and each $X^3$ is an electron-accepting group including two ester residual groups and a divalent aliphatic organic group linking the two ester residual groups, the divalent aliphatic organic group being one of substituted and unsubstituted, and $X^4$ is one of the same and different in each of the repeating unit according to Chemical Formula 9-1 and the repeating unit according to Chemical Formula 9-2, and each $X^4$ is independently one of hydrogen, a halogen, a substituted C1-C20 alkyl group, and an unsubstituted C1-C20 alkyl group.

13. The electron-donating polymer of claim 12, wherein $X^1$ and $X^2$ are one of same and different, and are each independently one of a substituted C1-C20 alkoxy group and an unsubstituted C1-C20 alkoxy group, $R^1$-$R^{11}$ are hydrogen,
$Z^1$-$Z^6$ are one of same and different, and are each independently one of hydrogen, —$SO_3R^{106}$, a halogen, —$NO_2$, —NO, and —CN, where $R^{106}$ is one of same and different in each of the at least one repeating unit according to one of Chemical Formulae 2-4, and is independently one of hydrogen, a substituted C1-C20 aliphatic organic group, and an unsubstituted C1-C20 aliphatic organic group,
$X^3$ is one of same and different in each of the repeating unit according to Chemical Formulae 9, 9-1, and 9-2, and each $X^3$ is an electron-accepting group including two ester residual groups and a divalent aliphatic organic group linking the ester residual groups, the divalent aliphatic organic group being one of substituted and unsubstituted, and
$X^4$ is hydrogen.

14. The electron-donating polymer of claim 9, wherein the repeating unit A includes repeating units according to one of the following Chemical Formulae 7-1 to 7-3, and a combination thereof, and the repeating unit B includes a repeating unit according to the following Chemical Formula 12,

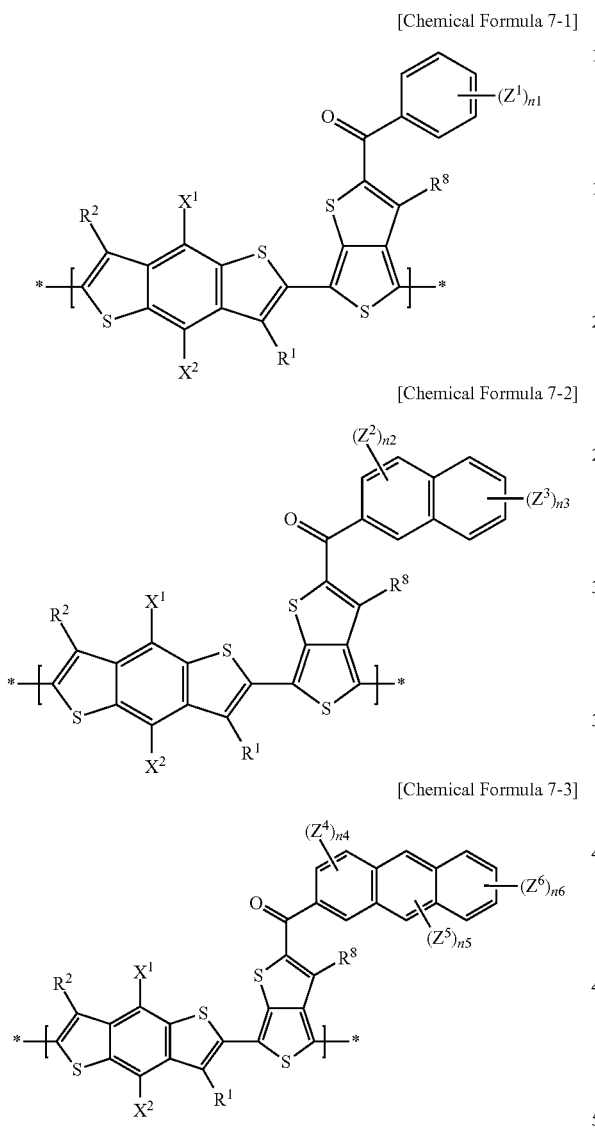

[Chemical Formula 7-1]

[Chemical Formula 7-2]

[Chemical Formula 7-3]

in Chemical Formulae 7-1 to 7-3, $X^1$ and $X^2$ are one of same and different, and are each independently one of
a substituted C1-C20 alkyl group, an unsubstituted C1-C20 alkyl group, a substituted C1-C20 alkoxy group, an unsubstituted C1-C20 alkoxy group, a substituted C1-C20 ester group, an unsubstituted C1-C20 ester group, and —$SR^{100}$, where $R^{100}$ is one of
a substituted C1-C20 alkyl group, an unsubstituted C1-C20 alkyl group, a substituted C2-C30 heterocycloalkyl group, and an unsubstituted C2-C30 heterocycloalkyl group,
$R^1$ and $R^2$ are one of same and different, and are each independently one of hydrogen, a substituted C1-C20 alkyl group, and an unsubstituted C1-C20 alkyl group,
$R^3$, $R^5$, and $R^8$ are one of same and different, and are each independently one of hydrogen and a halogen, $Z^1$-$Z^6$ are one of same and different, and are each independently one of hydrogen, —$SO_3R^{106}$, a halogen, —$NO_2$, —NO, and —CN, where $R^{106}$ is one of same and different in each of the at least one repeating unit according to one of Chemical Formulae 2-4, and is independently one of hydrogen, a substituted C1-C20 aliphatic organic group, and an unsubstituted C1-C20 aliphatic organic group,
$n_1$ is an integer that is one of 1 and 2,
$n_2$ is an integer ranging from 0 to 2, inclusive,
$n_3$ is an integer ranging from 0 to 2, inclusive,
$n_2+n_3$ is an integer that is one of 1 and 2,
$n_4$ is an integer ranging from 0 to 2, inclusive,
$n_5$ is an integer ranging from 0 to 2, inclusive,
$n_6$ is an integer ranging from 0 to 2, inclusive,
$n_4+n_5+n_6$ is an integer that is one of 1 and 2,

[Chemical Formula 12]

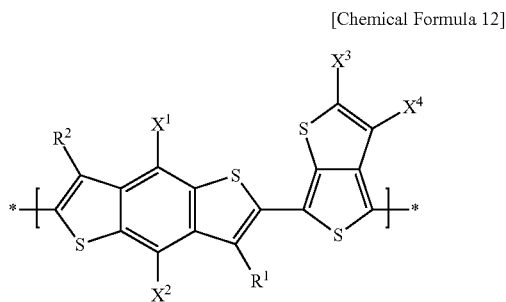

and, in Chemical Formula 12, $X^1$ and $X^2$ are one of same and different, and are each independently one of
a substituted C1-C20 alkyl group, an unsubstituted C1-C20 alkyl group, a substituted C1-C20 alkoxy group, an unsubstituted C1-C20 alkoxy group, a substituted C1-C20 ester group, an unsubstituted C1-C20 ester group, and —$SR^{100}$, where $R^{100}$ is one of
a substituted C1-C20 alkyl group, an unsubstituted C1-C20 alkyl group, a substituted C2-C30 heterocycloalkyl group, and an unsubstituted C2-C30 heterocycloalkyl group,
$R^1$ and $R^2$ are one of the same and different, and are each independently one of hydrogen, a substituted C1-C20 alkyl group, and an unsubstituted C1-C20 alkyl group,
$X^3$ is one of same and different in each of the repeating unit according to Chemical Formula 12, and each $X^3$ is an electron-accepting group including two ester residual groups and a divalent aliphatic organic group linking the two ester residual groups, the divalent aliphatic organic group being one of substituted and unsubstituted, and
$X^4$ is one of same and different in each of the repeating unit according to Chemical Formula 12, and each is independently one of hydrogen, a halogen, a substituted C1-C20 alkyl group, and an unsubstituted C1-C20 alkyl group.

15. The electron-donating polymer of claim 14, wherein $X^1$ and $X^2$ are one of same and different, and are each independently one of a substituted C1-C20 alkoxy group, and an unsubstituted C1-C20 alkoxy group,
$R^1$-$R^3$, $R^5$, and $R^8$ are hydrogen,
the $Z^1$-$Z^6$ are one of same and different, and are each independently one of hydrogen, —$SO_3R^{106}$, a halogen, —$NO_2$, —NO, and —CN, where $R^{106}$ is one of same and different in each of the at least one repeating unit according to one of Chemical Formulae 2-4, and is independently one of hydrogen, a substituted C1-C20 aliphatic organic group, and an unsubstituted C1-C20 aliphatic organic group, $X^3$ is one of same and different in each of the repeating unit according to Chemical Formula 12, and each is independently an electron-accepting group including two ester residual groups and a divalent aliphatic organic group linking the two ester residual groups, the divalent aliphatic organic group being one of substituted and unsubstituted, and $X^4$ is hydrogen.

16. The electron-donating polymer of claim 9, wherein the electron-donating polymer includes the repeating unit A and the repeating unit B in a mole ratio of about 1.10 to 10:1.

17. The electron-donating polymer of claim 9, wherein a number average molecular weight of the electron-donating polymer is about 1000 to about 800,000.

18. The electron-donating polymer of claim 9, wherein a bandgap of the electron-donating polymer is about 1.2 eV to about 2.5 eV.

19. An organic solar cell comprising:
an anode;
a cathode; and
a photoactive layer between the anode and the cathode, the photoactive layer including an electron donor and an electron acceptor, the electron donor including the electron-donating polymer according to claim 1.

20. The electron-donating polymer of claim 1, wherein the repeating unit according to Chemical Formula 1 is an electron donating group.

21. The electron-donating polymer of claim 20, wherein the at least one repeating unit according to one of Chemical Formulae 2-4 includes an electron accepting functional group.

22. The electron-donating polymer of claim 21, further comprising:
a repeating unit B including a repeating unit according to Chemical Formula 9,

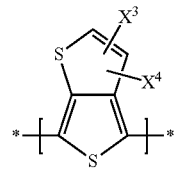

[Chemical Formula 9]

wherein in Chemical Formula 9 $X^3$ is one of same and different in each of the repeating unit according to Chemical Formula 9, and each $X^3$ is an electron-accepting group including two ester residual groups and a divalent aliphatic organic group linking the two ester residual groups, the divalent aliphatic organic group being one of substituted and unsubstituted, and $X^4$ is one of same and different in each of the repeating unit according to Chemical Formula 9, and each $X^4$ is independently one of
hydrogen, a halogen, a substituted C1-C20 aliphatic organic group, an unsubstituted C1-C20 aliphatic organic group, a hydroxy group, a substituted C1-C20 alkoxy group, an unsubstituted C1-C20 alkoxy group, a substituted C1-C20 ester group, an unsubstituted C1-C20 ester group, a thiol group, and —$SR^{107}$, where $R^{107}$ is one of
a substituted C1-C20 aliphatic organic group, an unsubstituted C1-C20 aliphatic organic group, a substituted C2-C30 aromatic organic group, an unsubstituted C2-C30 aromatic organic group, a substituted C2-C30 heterocycloalkyl group, and an unsubstituted C2-C30 heterocycloalkyl group.

23. The electron-donating polymer of claim 22, wherein the repeating unit A and the repeating unit B are copolymerized with each other.

24. The electron-donating polymer of claim 23, wherein the repeating unit is a compatibilizer including an electron accepting group.

25. The electron-donating polymer of claim 21, wherein the electron-donating polymer is a single phase polymer.

* * * * *